(12) United States Patent
Cloutier et al.

(10) Patent No.: US 9,450,629 B2
(45) Date of Patent: Sep. 20, 2016

(54) SYSTEMS AND METHODS FOR CONTROLLING LOCAL OSCILLATOR FEED-THROUGH

(75) Inventors: Mark M. Cloutier, Gatineau (CA); Tudor Lipan, Ottawa (CA); Christian Cojocaru, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 647 days.

(21) Appl. No.: 13/104,378

(22) Filed: May 10, 2011
(Under 37 CFR 1.47)

(65) Prior Publication Data
US 2012/0033758 A1 Feb. 9, 2012

Related U.S. Application Data

(63) Continuation of application No. 11/758,730, filed on Jun. 6, 2007, now Pat. No. 7,941,106.

(60) Provisional application No. 60/917,138, filed on May 10, 2007.

(51) Int. Cl.
| | |
|---|---|
| *H04B 17/00* | (2015.01) |
| *H04B 1/30* | (2006.01) |
| *H04L 27/00* | (2006.01) |
| *H04L 27/36* | (2006.01) |

(52) U.S. Cl.
CPC .............. *H04B 1/30* (2013.01); *H04L 27/0014* (2013.01); *H04L 27/364* (2013.01); *H03C 2200/0058* (2013.01); *H03C 2200/0079* (2013.01); *H04L 2027/0018* (2013.01)

(58) Field of Classification Search
CPC .................................................. H03G 3/3042
USPC .................................................... 455/91–129
See application file for complete search history.

(56) References Cited

U.S. PATENT DOCUMENTS

| | | | |
|---|---|---|---|
| 4,093,989 A | * | 6/1978 | Flink et al. ................ 324/76.28 |
| 5,012,208 A | | 4/1991 | Maekinen et al. |
| 5,144,642 A | | 9/1992 | Weinberg et al. |
| 5,271,034 A | | 12/1993 | Abaunza |
| 5,276,450 A | | 1/1994 | Schwegman |
| 5,305,348 A | | 4/1994 | Izumi |
| 5,488,631 A | | 1/1996 | Gold et al. |

(Continued)

FOREIGN PATENT DOCUMENTS

KR  10-2006-0011201  2/2006

OTHER PUBLICATIONS

Christain Lanschutzer; Andreas Springer; Linus Maurer; Zdravko Boos; Robert Weigel; Integrated Adaptive LO Leakage Cancellation for W-CDMA Direct Upconversion Transmitters; IEEE Radio Frequency Intregrated Circuit Symposium; 2003; pp. 19-22.

(Continued)

*Primary Examiner* — Lana N Le
(74) *Attorney, Agent, or Firm* — Knobbe, Martens, Olson & Bear, LLP

(57) ABSTRACT

A method for controlling local oscillator (LO) feed-through in a direct transmitter includes detecting a signal level corresponding to LO feed-through in a radio frequency (RF) signal that is output by a direct transmitter. Responsive to detecting the signal level corresponding to LO feed-through, DC offset levels are modified for an in-phase (I) signal and/or a quadrature-phase (Q) signal in the direct transmitter.

22 Claims, 25 Drawing Sheets

(56) References Cited

U.S. PATENT DOCUMENTS

| | | | |
|---|---|---|---|
| 5,584,059 A * | 12/1996 | Turney et al. | 455/126 |
| 5,742,896 A | 4/1998 | Bose et al. | |
| 5,793,817 A * | 8/1998 | Wilson | 455/115.1 |
| 5,805,242 A | 9/1998 | Strolle et al. | |
| 6,704,551 B2 | 3/2004 | Riou et al. | |
| 6,724,835 B1 * | 4/2004 | Shenoi | 375/326 |
| 6,745,015 B2 | 6/2004 | Yochem | |
| 6,940,916 B1 | 9/2005 | Warner et al. | |
| 7,359,853 B2 | 4/2008 | Holmes | |
| 7,650,122 B2 | 1/2010 | Itkin et al. | |
| 7,688,880 B2 * | 3/2010 | Haub et al. | 455/552.1 |
| 7,809,338 B2 | 10/2010 | Tsfati | |
| 7,941,106 B2 | 5/2011 | Cloutier et al. | |
| 2002/0181611 A1 | 12/2002 | Kim | |
| 2005/0032487 A1 * | 2/2005 | Montalvo | 455/126 |
| 2005/0101269 A1 * | 5/2005 | Dale et al. | 455/115.1 |
| 2005/0243953 A1 | 11/2005 | Beyer et al. | |
| 2006/0063497 A1 * | 3/2006 | Nielsen | 455/118 |
| 2007/0123182 A1 | 5/2007 | Dekker | |
| 2007/0258542 A1 * | 11/2007 | Cleveland | 375/296 |
| 2008/0070532 A1 * | 3/2008 | Moffatt et al. | 455/226.1 |
| 2008/0242246 A1 | 10/2008 | Minnis et al. | |
| 2009/0267701 A1 * | 10/2009 | Parsa et al. | 332/103 |
| 2009/0285334 A1 * | 11/2009 | Birkett et al. | 375/319 |
| 2010/0022200 A1 * | 1/2010 | Cole et al. | 455/77 |
| 2012/0253736 A1 * | 10/2012 | Nielsen | 702/130 |

OTHER PUBLICATIONS

International Preliminary Report on Patentability of Nov. 10, 2009 for International Patent Application No. PCT/US2008/062978 filed May 8, 2008. 7 pages.

Supplementary European Search Report of Nov. 2, 2012 for European Patent Application No. EP 08 74 7823 filed on Oct. 28, 2009. 7 pages.

* cited by examiner

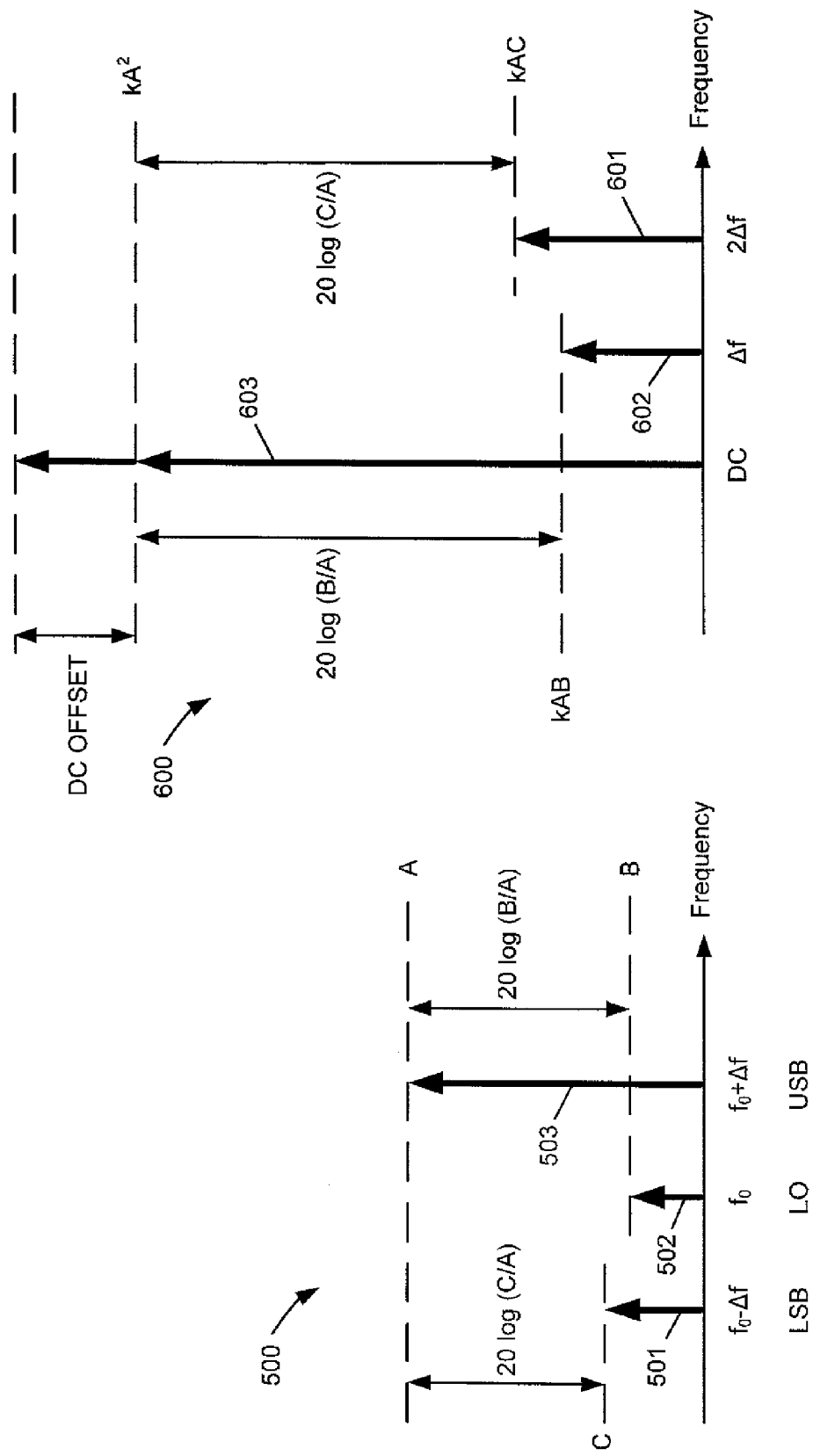

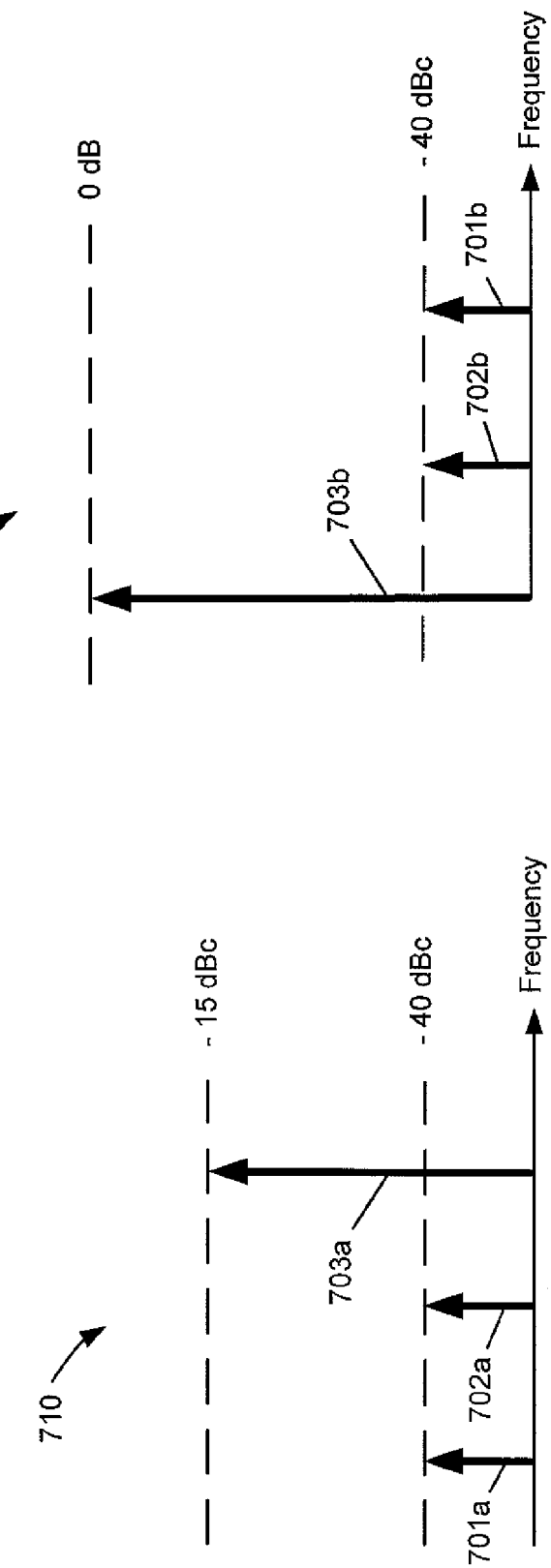

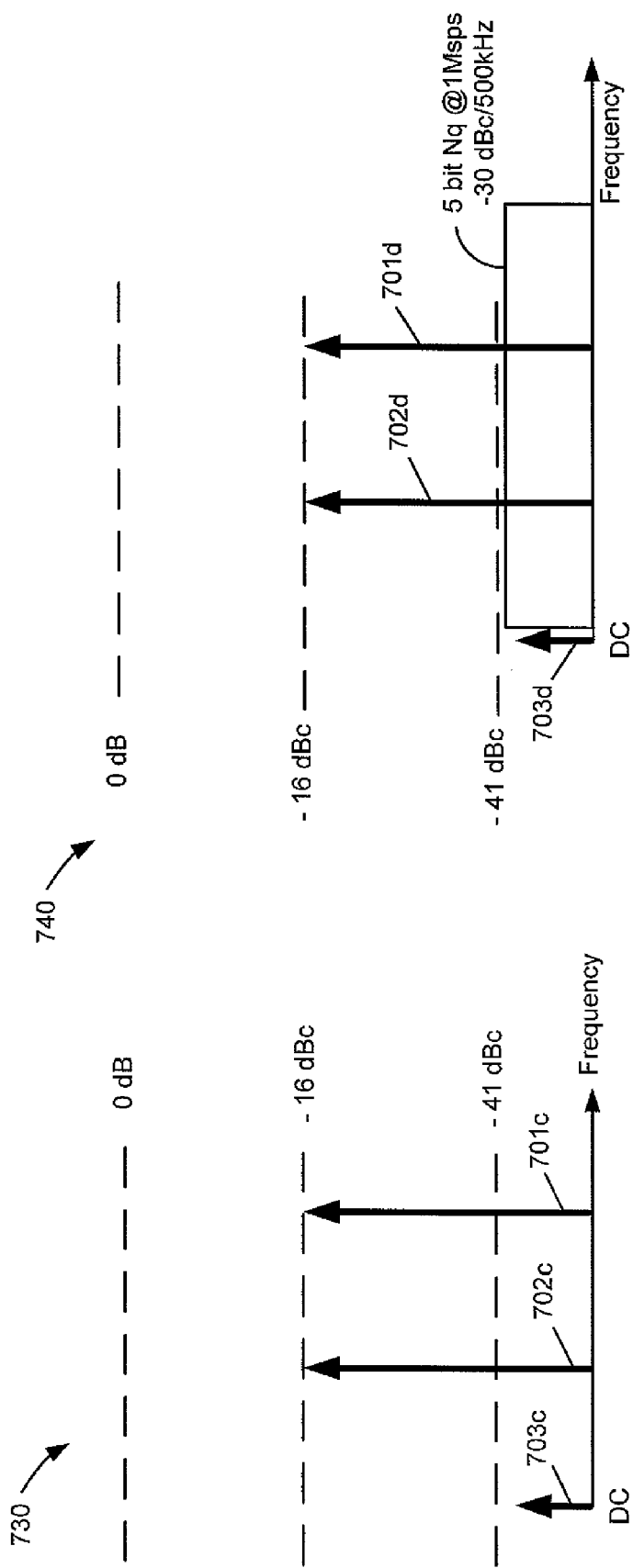

US 9,450,629 B2

SYSTEMS AND METHODS FOR CONTROLLING LOCAL OSCILLATOR FEED-THROUGH

RELATED APPLICATIONS

This application is a continuation of U.S. patent application Ser. No. 11/758,730, filed on Jun. 6, 2007, entitled "SYSTEMS AND METHODS FOR CONTROLLING LOCAL OSCILLATOR FEED-THROUGH," and claims priority to U.S. Provisional Application No. 60/917,138, filed on May 10, 2007, entitled "METHOD TO CALIBRATE OR CONTINUOUSLY MONITOR AND CORRECT LO FEEDTHROUGH IN DIRECT TRANSMITTER," which is hereby incorporated herein by reference in its entirety.

BACKGROUND

Direct transmitters simplify and reduce the cost of the output stage of a transmitter integrated circuit (IC) because of the small number of components required, especially when compared with traditional superhetrodyne architectures. Modern wireless systems require strict power control for a transmitter and may require operation of a transmitter over a wide dynamic range. A problem with current direct transmitters is that undesired amounts of a local oscillator (LO) signal leak, also referred to as LO feed-through, to the output of the transmitter and corrupt the transmitter output signal. This problem is especially problematic if a transmitter employs a wide dynamic range. The levels of LO feed-through should be reduced to a value of approximately −40 dBc nominal, and in some cases, such as the so called 3G (third generation) technology, even further. Current approaches for controlling LO feed-through are complex, expensive, ineffective and/or unreliable.

SUMMARY

An embodiment of a method for controlling LO feed-through in a direct transmitter includes detecting a signal level corresponding to local oscillator (LO) feed-through in a radio frequency (RF) signal that is output by a transmitter, and responsive to detecting the signal level, modifying at least one of a DC offset level for an in-phase (I) signal in the transmitter and a DC offset for a quadrature-phase (Q) signal in the transmitter.

An embodiment of a system for controlling LO feed-through in a direct transmitter includes a detector circuit configured to cause a convolution of signal components of a transmitter output signal, the transmitter output signal being output by a transmitter, an amplification circuit configured to amplify a detector output signal that is output by the detector circuit, an analog-to-digital converter (ADC) configured to digitize an amplified signal that is output by the amplification circuit, a digital filter configured to filter a digital signal that is output by the ADC, and a processor that is programmed to detect a signal level corresponding to local oscillator (LO) feed-through in the transmitter output signal, and responsive to detecting the signal level, cause at least one of a DC offset level for an in-phase (I) signal in the transmitter and a DC offset for a quadrature-phase (Q) signal in the transmitter to change.

Another embodiment of a system for controlling LO feed-through in a direct transmitter includes means for detecting a signal level corresponding to local oscillator (LO) feed-through in a radio frequency (RF) signal that is output by a transmitter, and means for modifying at least one of a DC offset level for an in-phase (I) signal in the transmitter and a DC offset for a quadrature-phase (Q) signal in the transmitter responsive to detecting the signal level.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIG. 5 depicts an exemplary output spectrum of an embodiment of the direct transmitter shown in FIG. 4.

FIG. 6 depicts selected components of an exemplary output spectrum of a detector shown in FIG. 3.

FIG. 7A depicts exemplary signal components that are provided to an embodiment of an LO feed-through control system shown in FIG. 3.

FIG. 7B depicts exemplary signal components that are output by an embodiment of a detector shown in FIG. 3.

FIG. 7C depicts exemplary signal components that are output by an embodiment of a variable gain amplifier shown in FIG. 3.

FIG. 7D depicts exemplary digital signal components that are output by an embodiment of an analog-to-digital converter (ADC) shown in FIG. 3.

DETAILED DESCRIPTION

Imperfections in one or more transmitter circuit components can lead to undesirable DC offsets in an in-phase (I) and/or a quadrature-phase (Q) signal in a transmitter. When a signal having an undesirable DC offset is mixed with a local oscillator (LO) signal, an LO feed-through component is generated in the resulting signal. It can be difficult to determine an amount of DC offset that results in a particular level of LO feed-through, such as, for example, −30 dBc. A simulation can be used to estimate a range of DC offset levels and corresponding LO feed-through levels.

In an embodiment, a calibration digital to analog converter (DAC) can be used to provide a DC offset to an I or Q signal to counteract an undesirable DC offset in such a signal. The calibration DAC can provide a range of DC offsets for adequate correction of LO feed-through levels as high as, for example, −20 dBc. It is desirable to have adjustment capabilities that exceed a suppression target by, for example, 10 dB or more. This will allow a transmitter to have gain control over a wider dynamic range without violating error vector magnitude (EVM) or LO leakage specifications. It is also desirable to limit LO feed-through to no more than about 3% of an LO AC level.

In an embodiment a detector can be used at an output of a transmitter mixer to help detect an amount of LO feed-through present on a transmission signal. Control of the detector can be via a calibration state machine or directly via a serial port. The output of the detector is AC-coupled to an N-bit sensor digital-to-analog converter (DAC). The output of the DAC is sampled and then digitally filtered to optimize measurement of a test sinusoid at a target frequency. Data from the DAC can be exported to an external host for test purposes. Baseband DC offsets can be calibrated by measuring the effects of the DC offsets on LO feed-through.

Figure 1:
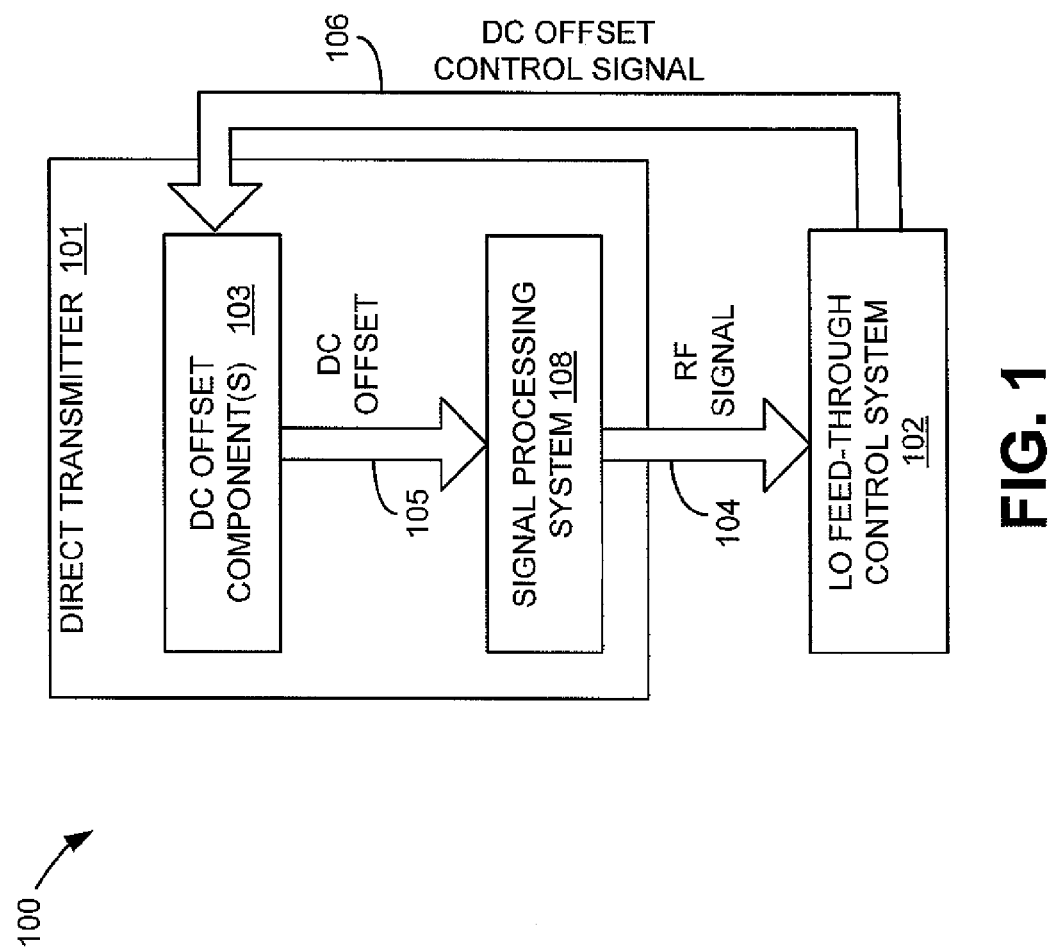
FIG. 1 is a block diagram depicting selected components of an embodiment of a communication device.

FIG. 1 is a block diagram depicting selected components of an embodiment of a communication device 100. The communication device 100 can be a portable cellular-type communication handset, a smart phone, a personal digital assistant (PDA), or any other portable communication device in which it is desirable to minimize the amount of LO feed-through in the transmit signal. The communication device 100 includes a direct transmitter 101 and an LO feed-through control system 102. The direct transmitter 101 is generally operated with a low or no intermediate frequency (F) and inclues at least one DC offset component 103 and a signal processing system 108. The signal processing system 108 is configured to output an RF signal 104.

The LO feed-through control system 102 measures the amount of LO feed through present in the RF signal 104 and then determines a DC offset level responsive to the detected level of LO feed through to minimize the LO feed-through in the RF signal 104. The LO feed-through control system 102 then provides a DC offset control signal 106 to a DC offset component 103. The DC offset component 103 receives the DC offset control signal 106 and provides a corresponding DC offset 105 to the signal processing system 108. The DC offset 105 can be based on current and/or previous detected levels of LO feed through.

The DC offset 105 is applied in the signal processing system 108 to a signal that is a precursor to the RE signal 104. The modified DC offset level of the signal in the signal processing system 108 changes a level of LO feed-through in the RF signal 104. In an embodiment, the LO feed-through control system 102 continues to output DC offset control signals having different values until an optimum DC offset level corresponding to a minimum level of LO feed-through is determined. An indication of the optimum DC offset level can be stored in the LO feed-through control system 102. A DC offset control signal 106 corresponding to the optimum DC offset level is then provided by the LO feed-through control system 102 to the DC offset component 103. Note that in an alternative embodiment, the LO feed-through control system 102 can be implemented as part of the direct transmitter 101.

Figure 2:
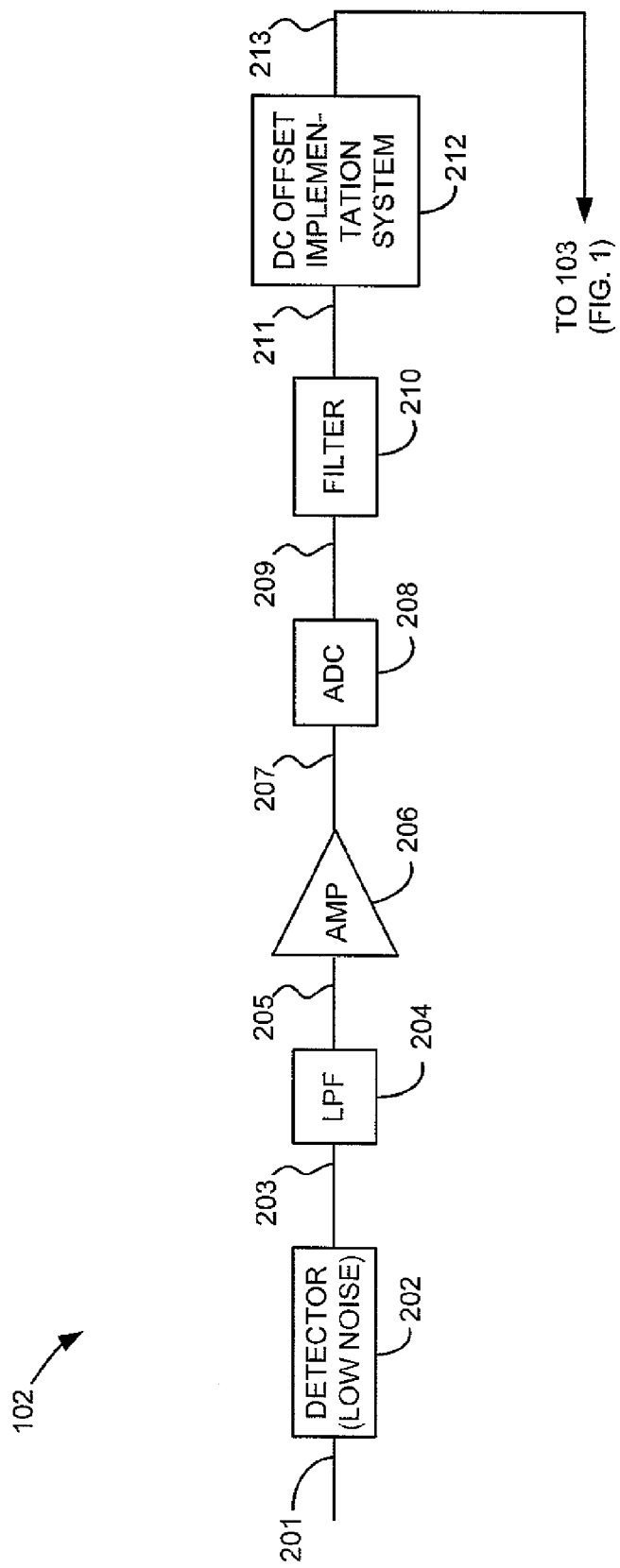
FIG. 2 is a block diagram depicting an embodiment of a local oscillator (LO) feed-through control system shown in FIG. 1.

FIG. 2 is a block diagram depicting an embodiment of the LO feed-through control system 102 shown in FIG. 1. The LO feed-through control system 102 includes a low noise detector 202 that receives an RF signal via connection 201. In an embodiment, the received RF signal includes a data signal and/or an injected test signal and an amount of LO feed-through. The injected test signal can be, for example, a single side-band (SSB) sinusoid having a frequency Δf of about 100 kHz, among other possible frequencies.

The low noise detector 202 convolves components of the RF signal received via connection 201 and outputs a corresponding detector signal via connection 203. Convolving components of the RF signal received via connection 201 results in larger signal components, as discussed, for example, in reference to FIG. 6 and Table 1 below.

An AC-coupled low pass filter 204 filters the detector signal received via connection 203 and outputs a corresponding filtered signal via connection 205. An amplifier 206 amplifies the filtered signal received via connection 205 to reduce the noise bandwidth and outputs a corresponding amplified signal via connection 207. In an embodiment, the amplifier 206 is a low DC offset variable gain amplifier that has a gain factor of no more than about 5, which avoids saturating the ADC 208. In a particular implementation, the amplifier 206 amplifies the output of the detector to within a range of approximately 100 mV to 1.25V. The AC-coupled low pass filter 204 and the amplifier 206 reduce the noise bandwidth around Δf. Note that the AC-coupled low pass filter 204 and the amplifier 206 can be implemented by a single circuit or by separate circuits.

An analog-to-digital converter (ADC) 208 digitizes the amplified signal received via connection 207 and outputs a corresponding digitized signal via connection 209. The quantization resolution (e.g., in bits) and the sample rates of the ADC 208 are variables that can be traded-off for calibration time. In general, the quantization rate of the ADC 208 is preferably greater than twice the noise bandwidth of a digital filter 210 used to filter the output of the ADC 208.

The digital filter 210 filters the digitized signal received via connection 209 to remove undesired components of the signal. The digital filter 209 then outputs a filtered signal via connection 211. The filtered signal output by the digital filter 209 includes a signal component corresponding to LO feed-through.

A DC offset implementation system 212 analyzes the filtered signal received via connection 211 and selects a DC offset control signal that is responsive to a level of LO feed-through detected in the filtered signal. The DC offset implementation system 212 can be configured such that the DC offset control signal is also responsive to previously detected levels of LO feed-through. The DC offset implementation system 212 then outputs the DC offset control signal via connection 213. The DC offset control signal causes a change in a DC offset value for an I and/or a Q signal in the direct transmitter 101 (FIG. 1).

In an embodiment, the DC offset implementation system 212 measures a power level at frequency Δf of the filtered signal using a digital detection method. Various algorithms can be used to measure the coupled power form the low noise detector 202 at frequency Δf. The AC coupling of the output of the low noise detector 202 removes an absolute power reference. The DC offset implementation system 212 can use various calibration techniques to minimize the LO feed-through to the required levels, usually the measured resolution of the DC offset implementation system 212.

The DC offset implementation system 212 can be configured to generate a predetermined series of successive DC offset control signals that result in corresponding changes in DC offset values for an I and/or a Q signal in the direct transmitter 101. The DC offset implementation system 212 then measures corresponding levels of LO feed-through in a signal output by the direct transmitter 101. The DC offset implementation system 212 then determines optimal I and/or Q DC offset levels corresponding to the lowest measured level of LO feed-through.

Various methods can be used by the DC offset implementation system 212 to determine optimal DC offset values. According to one such method, the DC offset implementation system 212 successively alters I and Q DC offset values in the transmitter 101. For example, DC offsets on an I signal are adjusted until an LO feed-through power minimum is reached relative to I DC offset values. Then DC offsets on a Q signal are adjusted until an LO feed-through power minimum is reached relative to Q DC offset values, thereby reaching a final LO suppression value.

Note that many alternative methods for determining optimal DC offset values can be used within the scope of this disclosure depending on a desired implementation. For example, an embodiment of one such method can be configured to minimize the time required to determine optimal DC offset values for a particular embodiment of a transmitter 101.

Furthermore, embodiments of an LO feed-through control system 102 can be configured to achieve various resolutions of LO feed-through measurement and various levels of LO feed-through suppression. All such embodiments are intended to be within the scope of this disclosure. An embodiment of the LO feed-through control system 102 described above includes a detector 202, an LPF 204, an amplifier 206, an ADC 208, a digital filter 210, and a DC offset implementation system 212. An alternative embodiment can include fewer, additional and/or different components than those described above.

Figure 3:
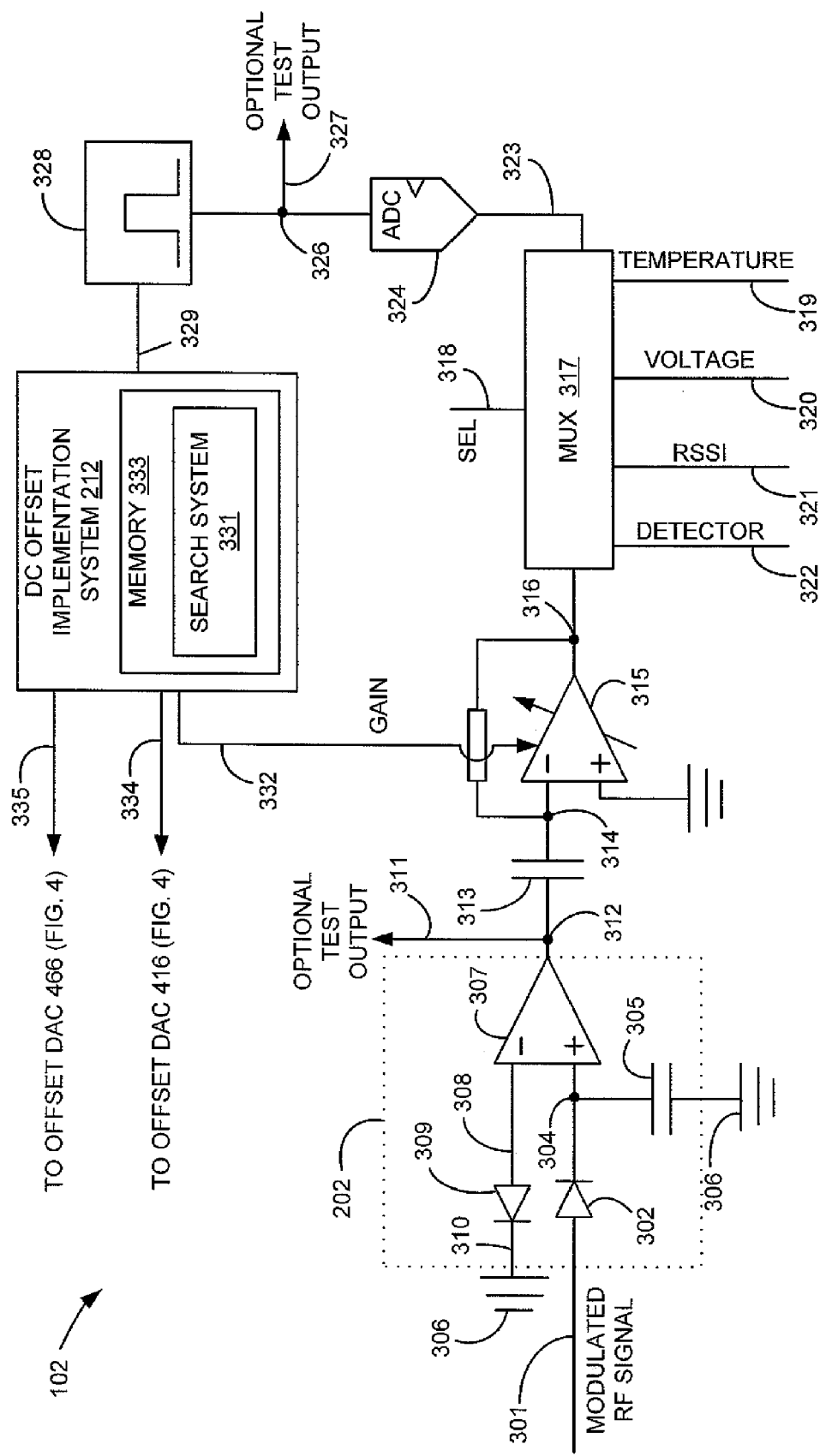
FIG. 3 is a circuit diagram depicting another embodiment of the LO feed-through control system shown in FIG. 1.

FIG. 3 is a circuit diagram depicting another embodiment of the LO feed-through control system 102 shown in FIG. 1. The LO feed-through control system 102 receives a modulated output signal of a direct transmitter 101 (FIG. 1) via connection 301. The transmitter output signal received via connection 301 includes a data signal and/or a test signal along with LO feed-through. The connection 301 is connected to an anode of a diode 302. The cathode of the diode 302 is connected to a node 304. The node 304 is connected to a first terminal of the capacitor 305 and to a non-inverting input of an amplifier 307. A second terminal of the capacitor 305 is connected to ground 306. The inverting input of amplifier 307 is connected to the anode of diode 309 via connection 308. The cathode of the diode 309 is connected to ground 306 via connection 310. The diodes 302 and 309, the capacitor 305 and the amplifier 307 form a detector 202. The detector 202 convolves components of the transmitter output signal received via connection 301.

In an embodiment, if an output spectrum of a transmitter 101 is applied to a detector 202 with a strong second order product, then a coherent spectrum is observed at the output of the detector 202, as illustrated, for example, in FIG. 6. An output spectrum of the detector 202 near DC will include a convolution of components of the transmitter 101 output spectrum. The products of the convolution will include cross product terms between an upper side-band (USB), a lower side band (LSB) and an LO feed-through tone, multiplied by a gain constant k of the detector 202.

The largest output tone of the transmitter 101 is the USB. This means that the three largest output tones of the detector 202 will be cross product terms with the USB tone. Assuming that an amplitude of a LSB is C, an amplitude of LO feed-through is B, and an amplitude of an USB is A, then in an exemplary embodiment, relative sizes of output tones of a detector 202 are as listed in the following Table 1:

TABLE 1

Examples of Output Tones of Detector 202

| Relative Size | Product | Power | Frequency | Relative Power |
|---|---|---|---|---|
| Large | $USB^2$ | $kA^2$ | DC | 0 dBc |
| Medium | USB*LO | kAB | 100 kHz | −40 dBc |
| Medium | USB*LSB | kAC | 200 kHz | −40 dBc |
| Small | $LO^2$ | $kB^2$ | DC | −80 dBc |
| Small | $LSB^2$ | $kC^2$ | DC | −80 dBc |
| Small | LSB*LO | kCB | 100 kHz | −80 dBc |

The three largest tones (USB2, USB*LO and USB*LSB) of the detector 202 output are depicted in FIG. 6. The USB self mixing term (USB2) is a DC response that adds to other DC terms such as DC offsets in the detector. The cross product terms kAB and kAC maintain their relative sizes to each other.

In an embodiment, a −40 dBc term at Δf (e.g., 100 kHz) will be about 1% of the response of the main DC term. Hence a 300 mV signal at DC would imply a 3 mV signal at Δf. About a 1.8V fall scale response could be expected from the detector 202 at DC. A −40 dBc ΔC output of the detector 202 can have about an 18 mV peak response. A signal output by the detector 202 can be in a range of about −50 dBc to as large as about −20 dBc (i.e., 6 mV to 180 mVpk).

The output of the detector 202 is provided to a node 312. The node 312 is connected to an optional test output connection 311 and to a first terminal of a capacitor 313. A second terminal of the capacitor 313 is connected to a node 314. The node 314 is connected to an inverting input of a variable gain amplifier 315. The variable gain amplifier 315 receives a gain control signal from a DC offset implementation system 212 via a connection 332. The variable gain amplifier 315 is configured to amplify an output signal of the detector 202.

In an embodiment, the output of the detector 202 is amplified by the variable gain amplifier 315 into a 1.25 V to 100 mV range of an N-bit sensor analog-to-digital converter (ADC) 324 without saturating the input of the ADC 324 with DC offsets. In this embodiment, the AC output of variable gain amplifier including noise components is significantly larger than a least significant bit (LSB) step of the ADC 324, thus ensuring that the ADC 324 toggles. The gain factor of the variable gain amplifier 315 can be, for example, 5 which avoids saturating the ADC 324 with the largest ADC 324 input signal.

The output of the variable gain amplifier 315 is provided to node 316. The node 316 is connected to an optional multiplexer 317. The multiplexer 317 has, in this example, a selection input connection 318, a temperature measurement input connection 319, a voltage measurement input connection 320, an RSSI (received signal strength indicator) measurement connection 321 and a detector signal connection 322.

Figure 4:
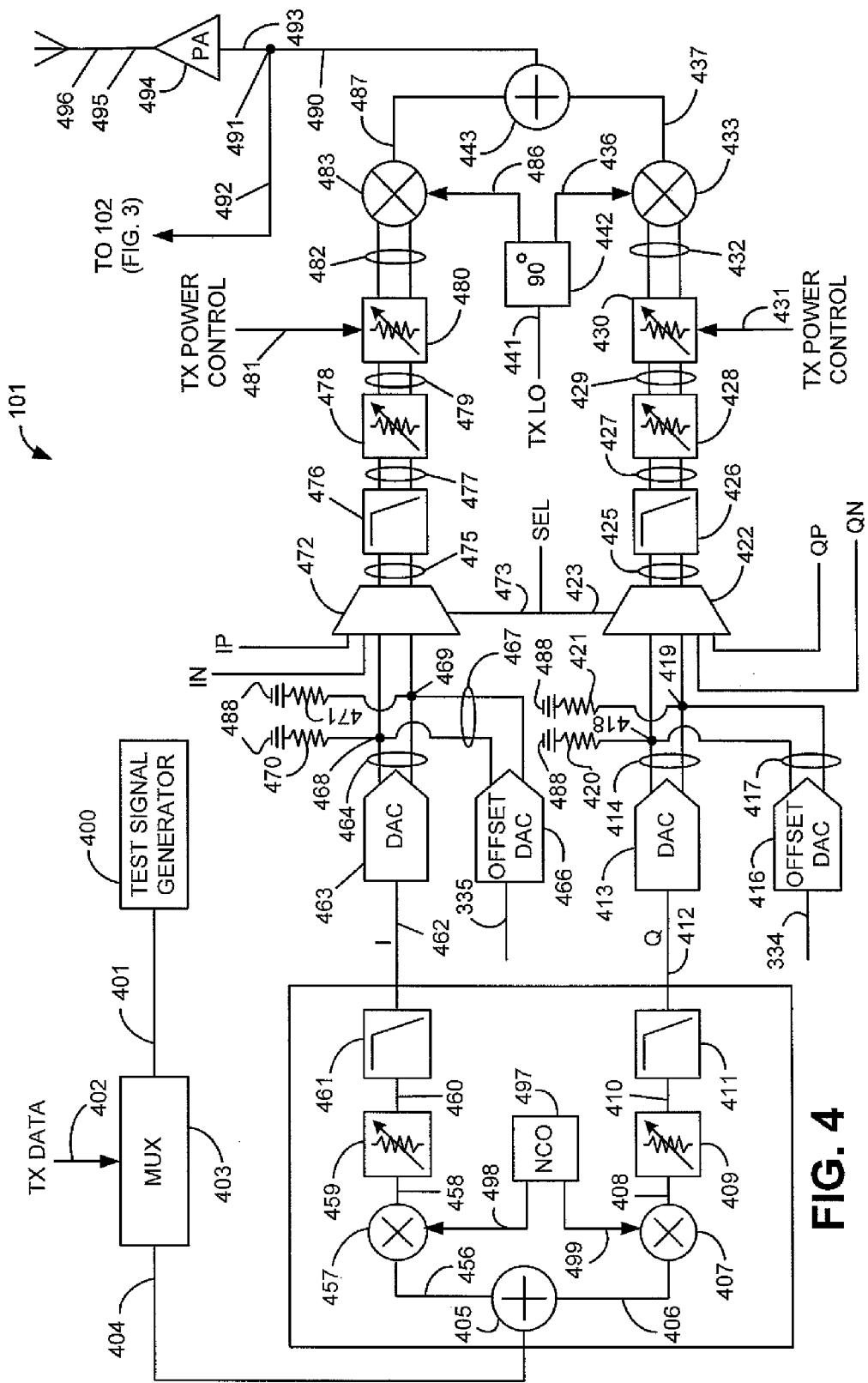
FIG. 4 is a circuit diagram depicting an embodiment of the direct transmitter shown in FIG. 1.

An output of the multiplexer 317 is connected to an analog-to-digital converter (ADC) 324 via connection 323. The ADC 324 digitizes an output signal of the variable gain amplifier 315. In an embodiment, the digitized signal would include responses at $\Delta f$ and $2\Delta f$, where $\Delta f$ is a frequency of a test signal that is injected in the transmitter 101 by, for example, a test signal generator 400 (FIG. 4).

An output of the ADC 324 is connected to node 326. The node 326 is connected to an optional test output connection 327 and to an input of a digital filter 328. The test output connection 327 may be connected to, for example, a serial or parallel port. The digital filter 328 filters an output signal of the ADC 324 to remove upper and lower sideband signals. Removing the sideband signals enables a more accurate measurement of LO feed-through.

In an embodiment, a digital filter 328 centered at $\Delta f$, preferably with a zero output at $2\Delta f$, will improve a signal-to-noise ratio (SNR) of a signal received from the ADC 324 while rejecting the $2\Delta f$ sideband. The power of $2\Delta f$ sideband could be as much as about 30 dB larger than an LO feed-through tone. Therefore it is desirable to have at least a 40 dB rejection of the $2\Delta f$ sideband in the digital filter 328. If the $\Delta f$ and $2\Delta f$ tones are multiples of each other, then a sine filter with a first zero at $2\Delta f$ can be used, but many alternative filtering schemes are also possible.

Many other filtering schemes are possible. One factor to be considered in selecting a filtering scheme is the signal-to-noise ratio (SNR) of an LO feed-through tone. For example, assuming that the Nyquist quantization noise power (Nq)=30 dBc for an examplary 5 bit ADC 324, and that the smallest signal is at −50 dBc and is −26 dBc with respect to a fall scale (FS) level, then the SNR in 500 kHz is about 4 dB. In this example, the digital filter 328 can be configured to reduce quantization noise by about 16 dB to account for the SNR while enabling an accurate measurement of LO feed-through in the output of the digital filter 328.

An output of the digital filter 328 is provided to a DC offset implementation system 212 via connection 329. The DC offset implementation system 212 determines an amount of LO feed-through present in the output of the digital filter 328 by measuring a level of a corresponding tone in a signal received via connection 329. An indication of the detected amount of LO feed-through can be stored in a memory 333 of the DC offset implementation system 212.

The memory 333 includes a search system 331 configured to search for an optimum DC offset level based on current and/or previously detected levels of LO feed-through. The DC offset implementation system 212 outputs respective offset DAC control signals via connections 334 and 335. The offset DAC control signals output via connections 334 and 335 can be either successive or simultaneous, depending on a desired implementation. The DC offset control signals output via connections 334 and 335 are configured to change DC offset levels for respective I and Q signals in a direct transmitter 101 (FIG. 1). In an embodiment, the DC offset control signals output via connections 334 and 335 are provided to offset DACs 466 and 416 (FIG. 4), respectively.

In an embodiment, a DC offset implementation system 212 (FIG. 3) measures power at $\Delta f$ (e.g., 100 kHz) and tunes the I and Q DC offsets for minimum power at $\Delta f$ so that LO feed-through at an output of transmitter 101 is at a minimum level. Note that a required signal-to-noise ratio (SNR) can affect calibration time.

In an embodiment, the DC offset implementation system 212 outputs a series of DC offset control signals that change DC offsets for an I signal in a transmitter 101 (FIG. 1). The levels of LO feed-through corresponding to the DC offsets are then measured. Data identified the measured levels of LO feed-through are then stored in a memory 333. A DC offset corresponding to the lowest level of LO feed-through is then selected and applied to the I channel. The DC offset implementation system 212 then outputs a series of DC offset control signals that change DC offsets for a Q signal in the transmitter 101. The levels of LO feed-through corresponding to the DC offsets are then measured. Data identifying the measured levels of LO feed-through are then stored in a memory 333. The DC offset corresponding to the lowest level of LO feed-through is then selected and applied to the Q channel. At this point, the LO feed-through is substantially eliminated. The process of applying series of DC offsets can be repeated to fine-tune the DC offset calibration. Note that in an alternative embodiment, an optimum DC offset can be determined for a Q channel prior to an I channel.

It should also be noted that an LO feed-through calibration procedure can be implemented in several ways including, for example, as follows:

1. The LO feed-through control system 102 can be set to operate once at power-on reset (POR), with input turned off from baseband, a power amplifier of the transmitter 101 turned off and a transmit/receive (T/R) switch open.

2. The search system 331 can be set to search automatically on command of a serial port with an option to power-up the power amplifier and close the T/R switch. This would allow the output of the transmitter 101 to be observed on a spectrum analyzer during operation of the LO feed-through control system 102.

3. The LO feed-through control system 102 can be set to allow a single point manual setting of either an I or Q offset DAC and to perform a single point measurement of LO feed-through.

If readily achievable, it is desirable to observe outputs of detector 202 and ADC 324. The output of ADC 324 can be provided to an external port to enable real-time monitoring of such output while other parameters, such as offset DACs 416 and 466 in the transmitter 101, are adjusted manually via, for example, a serial port connection. An analog monitoring point could also be used to monitor a level of LO feed-through that is responsive to DC offsets in a baseband processing stage. The analog monitoring can be achieved by digital filtering of a baseband signal and by using an output DAC to output the LO feed-through level in an analog form.

An LO feed-through control system 102 can be used in conjunction with various types of transmitters including, for example, a third generation (3G) transmitter. A 3G transmitter can save power by reducing mixer power consumption and a transmit power level over a required dynamic range (e.g., 80 dB) of the 3G transmitter. Therefore, a single point LO calibration can be ineffective at achieving a desired level of LO feed-through suppression in a 3G transmitter.

The LO feed-through control system 102 can be used for real-time continuous monitoring and adjustment of LO feed-through in a 3G transmitter. In such cases, there is no need to use a test signal. Instead, LO feed-through associated with an RF data signal can be measured.

When the LO feed-through control system 102 is used in real-time during transmission, the modulated output signal of the transmitter convolves with the LO feed-through and the difference term is downconverted with the same power as with the single sideband calibration done with a sinusoid. The difference is that, in this case, the LO feed-through is downconverted with the modulation of the signal applied to it.

The following are examples of approaches that can be used for continuous LO feed-through monitoring and adjustment:

1) Demodulate a downconverted LO feed-through term for maximum signal to noise ratio (SNR) and relatively slow adjustment. Small adjustments to DC offsets can be then made for I and Q signals in the transmitter 101 and the corresponding LO feed-through levels can be measured. The search system 331 would then search for a minimum level of LO feed-through.

2) A less complex method would make use of the fact that the modulation of the LO feed-through by random data will produce power in a signal band at baseband, and that the random data will affect the measured baseband power in a manner than can be modeled as a Gaussian process. Therefore, detecting, filtering and measuring pass band power of a transmission signal will enable continuous monitoring of LO feed-through levels.

The difference in the two approaches is the amount of filtering required for a given LO suppression level and the resulting loop bandwidths that can be applied to the feedback.

FIG. 4 is a circuit diagram depicting another embodiment of the direct transmitter 101 shown in FIG. 1. A test signal generator 400 transmits a test signal via connection 401. The test signal can be, for example, a single side-band (SSB) sinusoid having a frequency of approximately 100 kHz, among other possible frequencies. A multiplexer 403 receives the test signal via connection 401. The multiplexer is also configured to receive, via connection 402, data to be transmitted via transmitter 101. In an embodiment, the multiplexer 403 outputs either a data signal or a test signal via connection 404. The splitter 405 splits the output of the multiplexer into two outputs. In an embodiment, the splitter 405 outputs are substantially identical. One output of splitter 405 is provided to a mixer 407 via connection 406. Another output of splitter 405 is provided to a mixer 457 via connection 456.

A numerically controlled oscillator (NCO) 497 outputs oscillator signals via respective connections 498 and 499.

The mixer 407 mixes the oscillator signal received via connection 499 with a data and/or test signal received via connection 406 to develop a quadrature-phase (Q) portion of the transmit signal. An output of mixer 407 is provided to a variable attenuator 409 via connection 408. The variable attenuator 409 attenuates the signal received from the mixer 407.

An output of the variable attenuator 409 is provided to a low pass filter (LPF) 411 via connection 410. The LPF 411 filters the signal received from the variable attenuator 409. An output of the LPF 411 is provided to a digital-to-analog converter (DAC) 413 via connection 412. The DAC 413 converts a digital signal received from the LPF 411 into an analog signal. The DAC 413 outputs the analog signal via a differential connection 414 that is connected to nodes 418 and 419. Nodes 418 and 419 are connected to respective resistors 420 and 421 that are connected to ground 488.

An offset DAC control signal is provided to an offset DAC 416 via connection 334. In an embodiment, the offset DAC control signal is provided to the offset DAC 416 by the DC offset implementation system 212. The offset DAC 416 outputs a DC offset signal via a differential connection 417. A DC offset signal output by the offset DAC 416 results in a DC offset to a corresponding output from the DAC 413. The resulting DC offset at the output of the DAC 413 cancels at least some of the undesirable DC offset that is either already present in the signal output by the DAC 413 or that would otherwise be introduced to the output of the DAC 413 at a later processing stage. Canceling an undesirable DC offset in an I or Q signal can reduce or substantially eliminate LO feed-through in an output of the transmitter 101. An output of the DAC 413 is provided to a multiplexer 422 via connection 414. Analog QP and QN signals are also provided to the multiplexer 422. A select signal is provided to the multiplexer 422 via connection 423 to control the multiplexer 422.

An output of the multiplexer 422 is provided to a low pass filter (PF) 426 via connection 425. The LPF 426 filters the signal received from the multiplexer 422. An output of the LPF 426 is provided to a variable attenuator 428 via connection 427. The variable attenuator 428 attenuates the signal received from the LPF 426. An output of the variable attenuator 428 is provided to another variable attenuator 430 via connection 429. The variable attenuator 430 attenuates the signal received from the variable attenuator 428. An attenuator control signal is provided to the variable attenuator 430 via connection 431. An output of the variable attenuator 430 is provided to a mixer 433 via connection 432.

An LO signal is provided to a phase shifting component 442 via connection 441. The phase shifting component 442 divides the LO signal received via connection 441 into LO signals having a 90° phase difference. The phase shifting component 442 outputs the 90° phase-shifted LO signals via respective connections 436 and 486. The mixer 433 mixes a signal received via connection 432 with an LO signal received via connection 436. The mixer 433 then outputs a resulting RF signal via connection 437.

A mixer 457 mixes an oscillator signal received via connection 498 with a data and/or test signal received via connection 456 to develop the in-phase (I) portion of the transmit signal. An output of mixer 457 is provided to a variable attenuator 459 via connection 458. The variable attenuator 459 attenuates the signal received from the mixer 457. An output of the variable attenuator 459 is provided to a low pass filter (LPF) 461 via connection 460. The LPF 461 filters the signal received from the variable attenuator 459.

An output of the LPF 461 is provided to a digital-to-analog converter (DAC) 463 via connection 462. The DAC 463 converts a digital signal received from the LPF 461 into an analog signal. The DAC 463 outputs the analog signal via a differential connection 464 that is connected to nodes 468 and 469. Nodes 468 and 469 are connected to respective resistors 470 and 471 that are connected to ground 488.

An offset DAC control signal is provided to an offset DAC 466 via connection 335. In an embodiment, the offset DAC control signal is provided by the DC offset implementation system 212 (FIG. 3). The offset DAC 466 outputs a DC offset signal via a differential connection 467. A DC offset signal output by the offset DAC 466 results in a DC offset to a corresponding output from the DAC 463. The resulting DC offset at the output of the DAC 463 can cancel at least some of the undesirable DC offset that is either already present in the signal output by the DAC 463 or that would otherwise be introduced to the output of the DAC 463 at a later processing stage. An output of the DAC 463 is provided to a multiplexer 472 via connection 464. Analog IP and IN signals are also provided to the multiplexer 472. A select signal is provided to the multiplexer 472 via connection 473 to control the multiplexer 472.

An output of the multiplexer 472 is provided to a low pass filter (LPF) 476 via connection 475. The LPF 476 filters the signal received from the multiplexer 472. An output of the LPF 476 is provided to a variable attenuator 478 via connection 477. The variable attenuator 478 attenuates the signal received from the LPF 476. An output of the variable attenuator 478 is provided to another variable attenuator 480 via connection 479. The variable attenuator 480 attenuates the signal received from the variable attenuator 478. An attenuator control signal is provided to the variable attenuator 480 via connection 481. An output of the variable attenuator 480 is provided to a mixer 483 via connection 482. The mixer 483 mixes a signal received via connection 482 with an LO signal received via connection 486. The mixer 483 then outputs a resulting RF signal via connection 487.

A combiner 443 combines signals received via connections 437 and 487 respectively and outputs a resulting RF transmit signal via connection 490, which is connected to a node 491. A sample of the RF transmit signal can be provided to an LO feed-through control system 102 (FIG. 1) via a connection 301 connected to the node 491. A power amplifier 494 amplifies an RF signal received via connection 493 that is connected to the node 491. The power amplifier 494 provides an amplified RF signal to an antenna 496 via connection 495. The antenna 496 then transmits a wireless signal corresponding to the RF signal received via connection 495.

FIG. 5 depicts an exemplary output spectrum 500 of an embodiment of a direct transmitter 101 (FIG. 4). If a test signal at frequency $\Delta f$ is output by the test signal generator 400 (FIG. 4), then the output spectrum 500 will include an upper sideband (USB) 503 at frequency $f_0+\Delta f$; a lower side band (LSB) 501 at frequency $f_0-\Delta f$ and LO feed-through 502 at frequency $f_0$, where $f_0$ is a frequency of the LO signal provided via connection 441 (FIG. 4). The USB 503 is the largest component of the output spectrum 500. The LSB 501 is an undesired image of USB 503. Depending on various factors, the power of the LO feed though 502 can be, for example, between about −25 dBc to −40 dBc or lower.

FIG. 6 depicts selected components of an exemplary output spectrum 600 of a detector 202 (FIG. 3) that receives the output spectrum 500 (FIG. 5) as input. The output spectrum 600 is a result of a convolution of the output spectrum 500 with itself. The products of the convolution include cross-product terms between LSB 501, LO feed-through 502 and USB 503 (FIG. 5). Each of these cross-product terms is multiplied by a gain constant k of the detector. The largest three output tones 601, 602 and 603 of the detector 202 are the cross product terms with USB 503 (FIG. 5), which is the largest tone in the output spectrum 500. Output tone 603 is a result of a convolution of USB 503 with itself, output tone 601 is a result of a convolution of USB 503 with LSB 501, and output tone 602 is a result of a convolution of USB 503 with LO feed-through 502.

Assuming that an amplitude of LSB 501 is C, an amplitude of the LO feed-through 502 is B, and an amplitude of USB 503 is A, then output tone 601 has an amplitude of kAC, output tone 602 has an amplitude kAB, and output tone 603 has an amplitude of $kA^2$ plus a DC offset value. The difference in power between output tone 603 and output tone 602 is 20 log (B/A) and the difference in power between output tone 603 and output tone 601 is 20 log (C/A). The relative power of less significant signal components of detector 202 output is listed in Table 1 above.

FIGS. 7A-7D depict relative power of exemplary signal content at select locations in an embodiment of the LO feed-through control system 102 shown in FIG. 3. With reference to FIG. 7A, signal components 710 are provided to an LO feed-through control system 102 via connection 301 (FIG. 3). The signal components 710 include a lower side band (LSB) tone 701a, an LO feed-through tone 702a, and an upper side band (USB) tone 703a.

The LSB tone 701a has a frequency of $f_0-\Delta f$, the LO feed-through tone 702a has a frequency of $f_0$ and the USB tone 703a has a frequency of $f_0+\Delta f$, where $\Delta f$ is a frequency of a test signal that is generated in the transmitter 101 (FIG. 4) by the test signal generator 400. As an example, the LSB tone 701a and the LO feed-through tone 702a each have a power rating of about −40 dBc relative to the power of a USB tone 703b (FIG. 7B) at node 312. The USB tone 703a has power rating of about −15 dBc relative to the power of the USB tone 703b at node 312.

FIG. 7B depicts exemplary signal components 720 that are output by an embodiment of a detector 202 (FIG. 3). An output signal of a detector 202 includes a USB tone 703b with a power rating of about 0 dB, an LSB tone 701b with a power rating of −40 dBc, and an LO feed-through tone 702b with a power rating of about 40 dBc. USB tone 703b is a result of a convolution of USB tone 703a with itself, LSB tone 701b is a result of a convolution of USB tone 703a with LSB tone 701a, and LO feed-through tone 702b is a result of a convolution of USB tone 703a with LO feed-through tone 702a.

FIG. 7C depicts exemplary signal components 730 that are output by an embodiment of a variable gain amplifier 315 (FIG. 3). A signal that is output by the variable gain amplifier 315 includes a DC offset 703c with a power rating of under −41 dBc as well as an LSB tone 701c and an LO feed-through tone 702c with power ratings of about −16 dBc.

FIG. 7D depicts exemplary digital signal components 740 that are output by an embodiment of an ADC 324 (FIG. 3). In an embodiment, the ADC 324 is a 5 bit Nyquist ADC that samples an output of the variable gain amplifier 315 (FIG. 3) at a rate of 1 mega samples per second (1 Msps) and that has a noise density of approximately −30 dBc/500 kHz. The ADC 324 (FIG. 3) outputs a digital signal that includes a DC offset 703d with a power rating of under −41 dBc as well as an LSB tone 701d and an LO feed-through tone 702d with power ratings of about −16 dBc. The signal components 740 are provided to a digital filter 328 (FIG. 3).

Figure 7E:
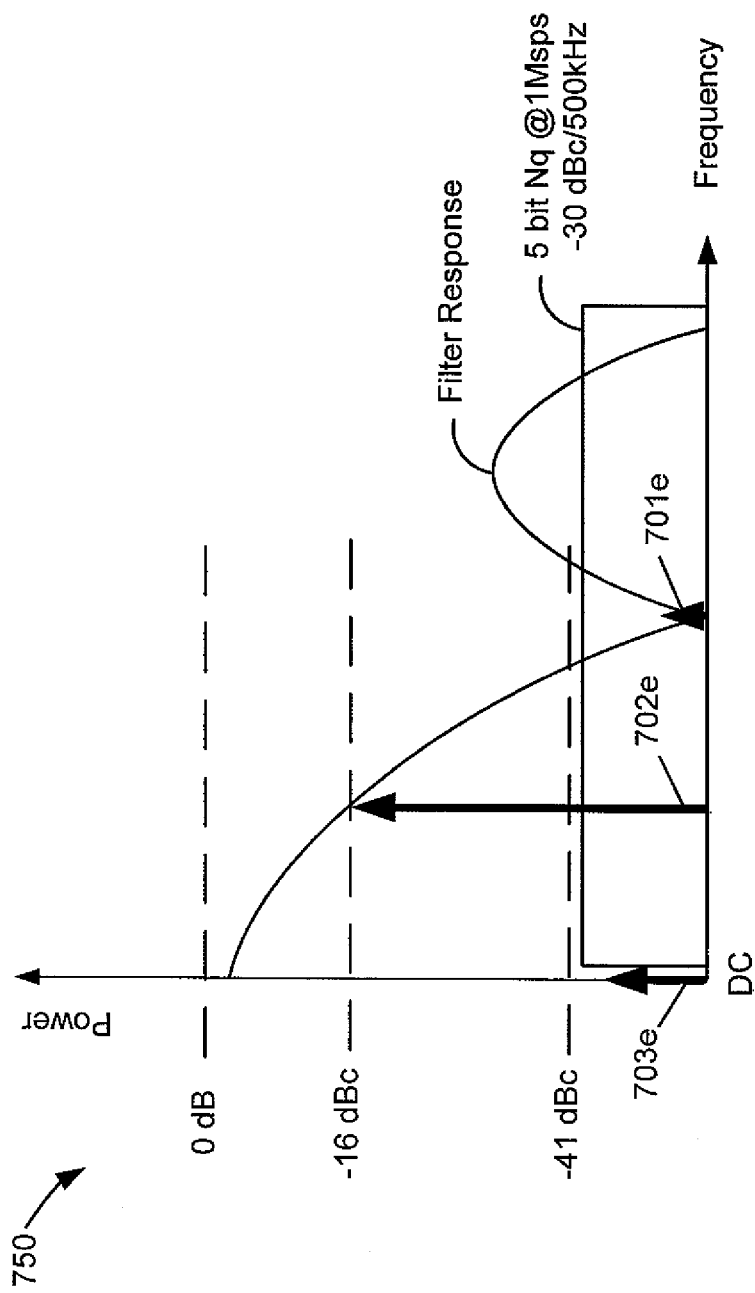
FIG. 7E depicts exemplary signal components output by an embodiment of a digital filter shown in FIG. 3.

FIG. 7E depicts exemplary signal components 750 output by an embodiment of a digital filter 328 (FIG. 3). The signal components 750 include a DC offset 703e with a power rating under −41 dBc, an LO feed-through tone 702e with a power rating of about −16 dBc, and an LSB tone 701e with a power rating of zero or near zero. The LSB tone 701e is generated as a result of the digital filter 328 substantially filtering out a corresponding LSB tone 701d (FIG. 7D). With the LO feed-through tone 702e being the most powerful tone at the output of the digital filter 328, it can be easily and accurately measured by the DC offset implementation system 212 (FIG. 3) with minimal or no interference from sideband tones.

Figure 8:
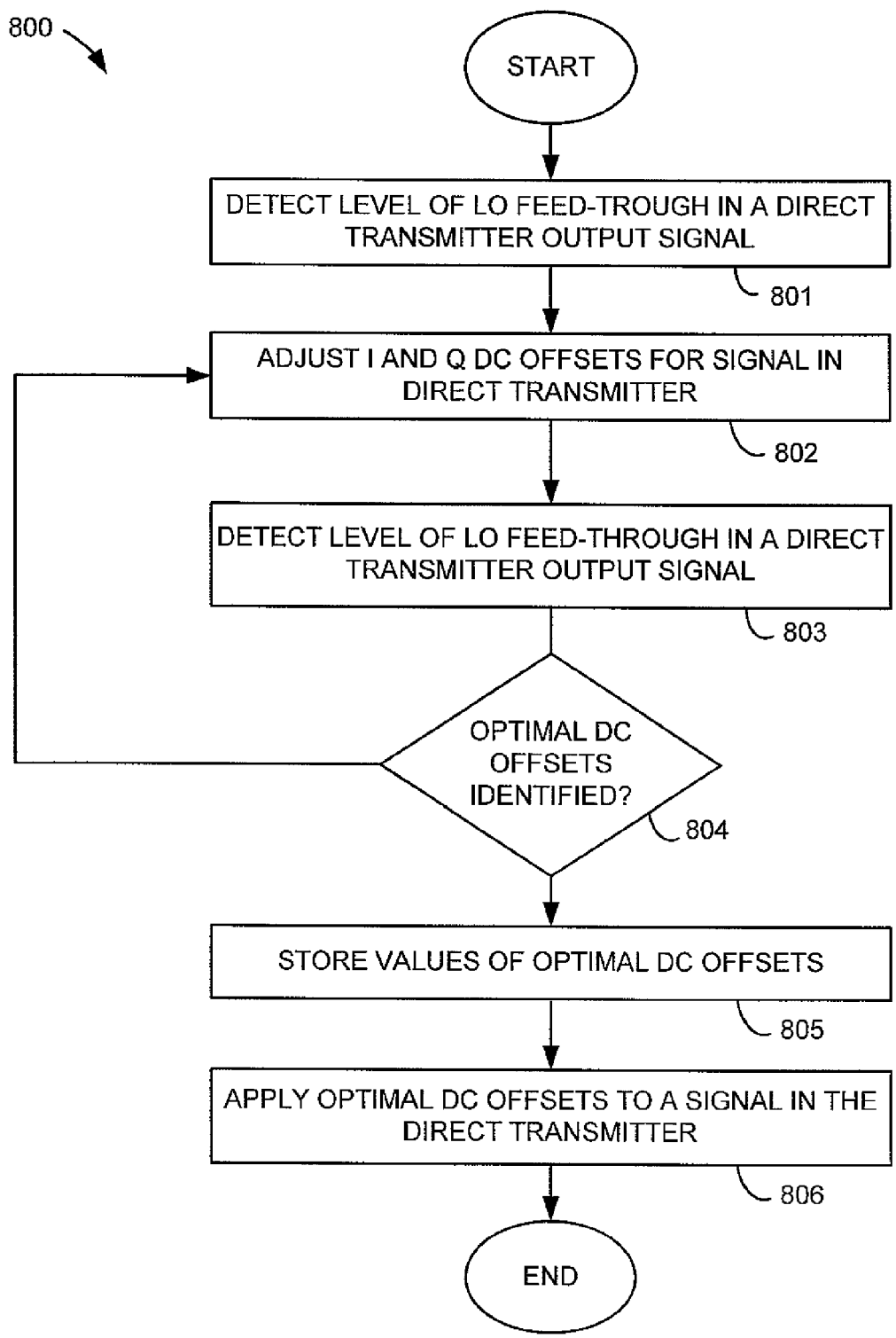
FIG. 8 is a flow chart depicting an embodiment of a method for minimizing LO feed-through in a direct transmitter shown in FIG. 1.

FIG. 8 is a flow chart depicting an embodiment of a method 800 for minimizing LO feed-through in a direct transmitter 101 (FIG. 1). As indicated in step 801, a level of LO feed-through in a direct transmitter output signal is detected. In an embodiment, an indication of the detected level of LO feed-through is stored in a memory 333 of a DC offset implementation system 212 (FIG. 3).

In-phase (I) and/or quadrature-phase (Q) DC offsets are adjusted for a signal in the direct transmitter 101, as indicated in step 802, in a manner that is responsive to the detected level of LO feed-through. The adjustment in I and Q DC offsets can be based on a current and/or previous detected levels of LO feed-through. Adjusting a DC offset for an I and/or Q signal alters a level of LO feed-through in an output signal of the direct transmitter 101.

The level of LO feed-through at the transmitter output is then detected again, as indicated in step 803. A determination is then made as to whether optimal DC offsets have been identified, as indicated in step 804. For example an analysis of current and previously detected levels of LO feed-through can determine whether a minimum level of LO feed-through has been achieved and, if so, what the corresponding DC offsets are.

If a determination is made in step 804 that optimal values of DC offsets have been identified, then such values are stored, as indicated in step 805. For example, optimal DC offset values can be stored in memory 333 (FIG. 3). The optimal DC offsets are then applied to a signal in the direct transmitter, as indicated in step 806. If, however, a determination is made in step 804 that optimal DC offset values have not been identified, then the method 800 returns to step 802 whereby DC offsets are re-adjusted based on continuing LO feed-through determination and analysis.

Figure 9A:
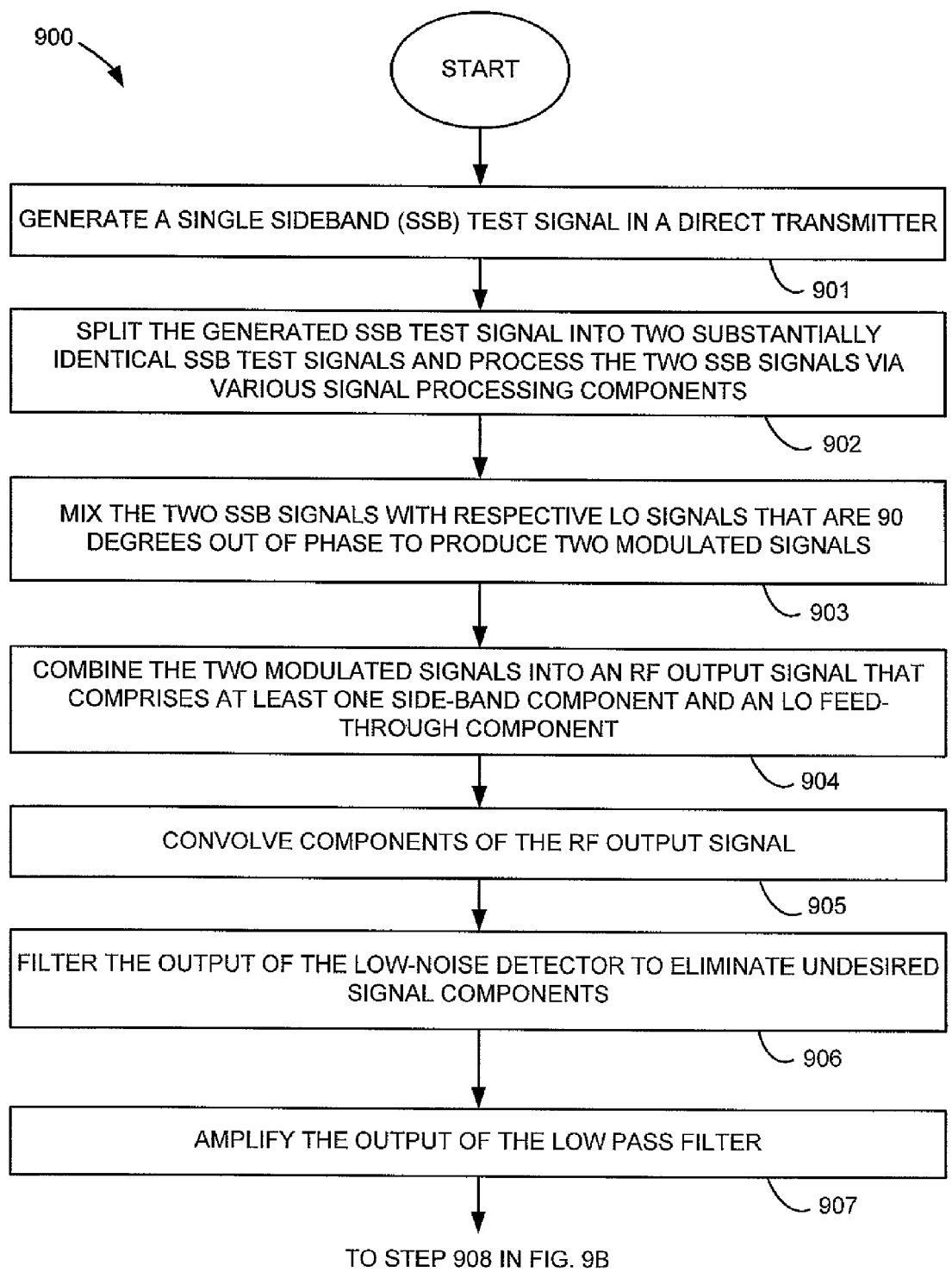
FIGS. 9A and 9B are flow charts collectively illustrating another embodiment of a method for minimizing LO feed-through in the direct transmitter shown in FIG. 1.
Figure 9B:
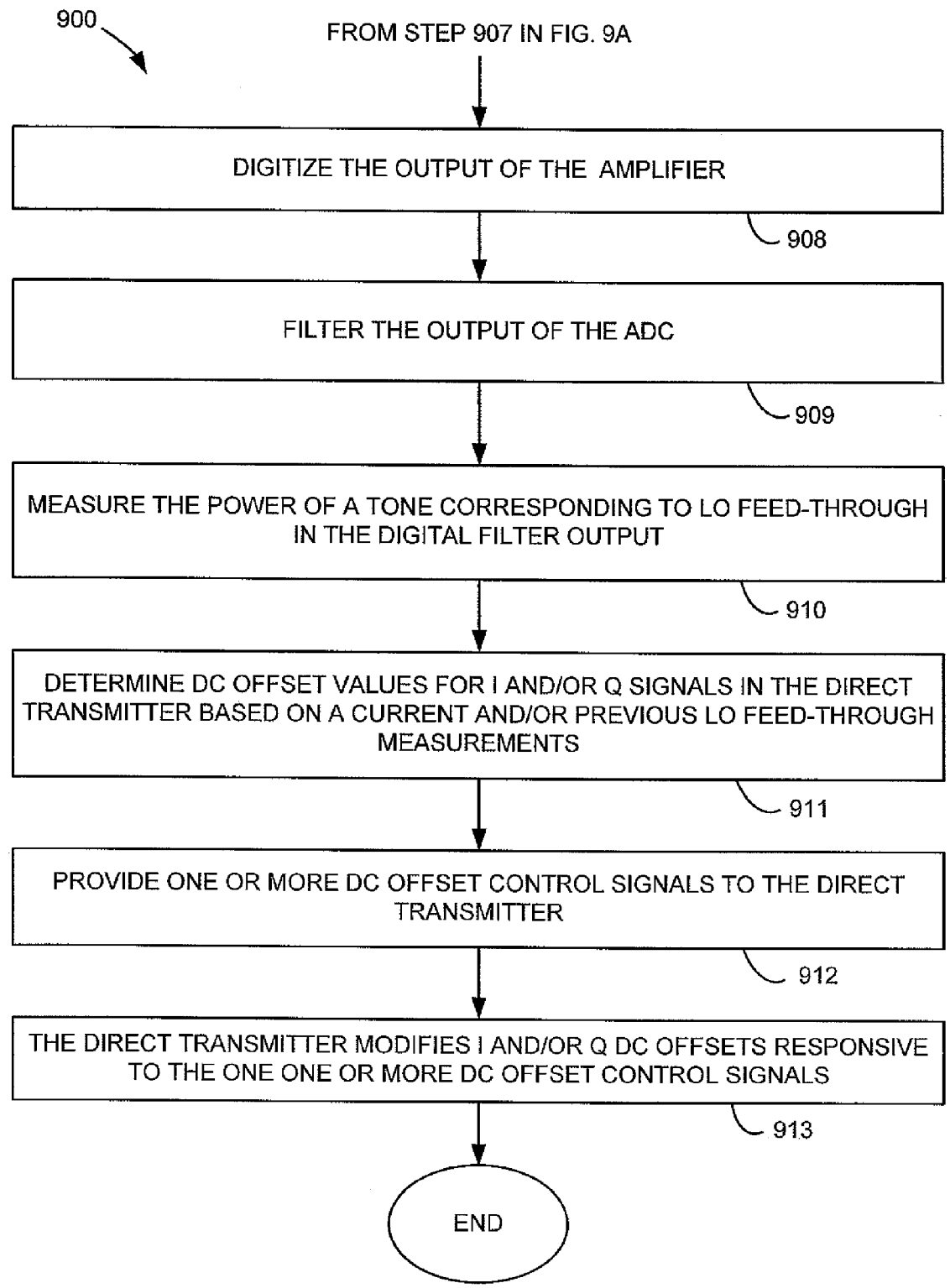

FIGS. 9A and 9B are flow charts collectively illustrating an embodiment of a method 900 for minimizing LO feed-through in a direct transmitter 101 (FIG. 4). As indicated in step 901, a single sideband (SSB) test signal is generated in a direct transmitter. The SSB test signal has an output frequency that is offset from an output LO frequency in the direct transmitter 101. For example, a test signal generator 400 (FIG. 4) can generate an SSB test signal having a frequency Δf of approximately 100 kHz, among other possible values.

The SSB test signal is then split into two substantially identical SSB signals that are then processed via various signal processing components in the direct transmitter 101, as indicated in step 902. One of the two SSB signals is processed by signal processing components corresponding to an in-phase (I) signal path and while the other is processed by signal components corresponding to a quadrature-phase (Q) signal path in the direct transmitter 101. The signal processing components can include, for example, signal processing components discussed above in reference to FIG. 4.

The two SSB test signals are then mixed with respective LO signals that are 90 degrees out of phase to produce two modulated signals, as indicated in step 903. The modulated signals are combined into an RF output signal that comprises at least one side-band component and an LO feed through component, as indicated in step 904. The RF output signal can include, for example, the components shown in FIG. 5.

In an embodiment, the following steps 905 through 912 can be implemented via, for example, an LO feed-through control system 102 (FIG. 3). A low-noise detector is used to convolve components of the RE output signal, as indicated in step 905. An example of signal components that are output by the low-noise detector circuit is shown in FIG. 5.

An AC-coupled low pass filter (LPF) is then used to filter the output of the low-noise detector to eliminate undesired signal components, as indicated in step 906. An amplifier is used to amplify the output of the LPF, as indicated in step 907. Alternatively an AC-coupled LPF with an analog gain stage may be used to perform steps 906 and 907.

An analog-to-digital converter (ADC) is used to digitize the output of the amplifier of step 907, as indicated in step 908. The quantization resolution (e.g., in bits) and the sample rates are variables that can be adjusted to arrive at an acceptable transmitter calibration time. In general, the quantization rate is preferably greater than twice the noise bandwidth of the preceding LPF.

A digital filter is then used to filter the output of the ADC, as indicated in step 909. The digital filter attenuates or eliminates a tone corresponding to a test signal. The power of a tone corresponding to LO feed-through in the digital filter output is then measured, as indicated in step 910. For example, signal power can be measured at a frequency Δf using a digital detection method.

A search system is then used to determine DC offset values for in-phase (I) and/or quadrature-phase (Q) signals of the direct transmitter 101 based on a current and/or previous LO feed-through measurements, as indicated in step 911. In an embodiment, the selected DC offset values can also be responsive to a temperature measurement, a power output range, and/or a channel frequency corresponding to the direct transmitter.

One or more DC offset control signals are then provided to the direct transmitter 101, as indicated in step 912. The DC offset control signals can be used, for example, to change the output of I and/or Q DC offset DACs in the direct transmitter 101. The direct transmitter 101 modifies DC offsets for I and/or Q signals responsive to the one or more DC offset control signals, as indicated in step 913. Changes in the DC offsets for I and/or Q signals in the direct transmitter 101 result in corresponding changes in LO feed-through in an output signal of the direct transmitter 101.

Steps in method 900 can be repeated until DC offsets corresponding to minimal or no LO feed-through are determined. For example, DC offsets on an I signal are adjusted until a minimum LO feed-through level is reached relative to I DC offset values. Then DC offsets on a Q signal are adjusted until a minimum LO feed-through level is reached relative to Q DC offset values, thereby reaching a final LO suppression value. Alternatively, DC offsets for a Q signal can be adjusted before DC offsets for an I signal.

Note that steps in the flow charts described above can be performed in a different order than that shown in the respective figures including substantially concurrently or in reverse order where feasible. Furthermore alternative embodiments within the scope of this disclosure can include fewer, additional and/or different steps than those described above, depending on desired implementations.

Figure 10:
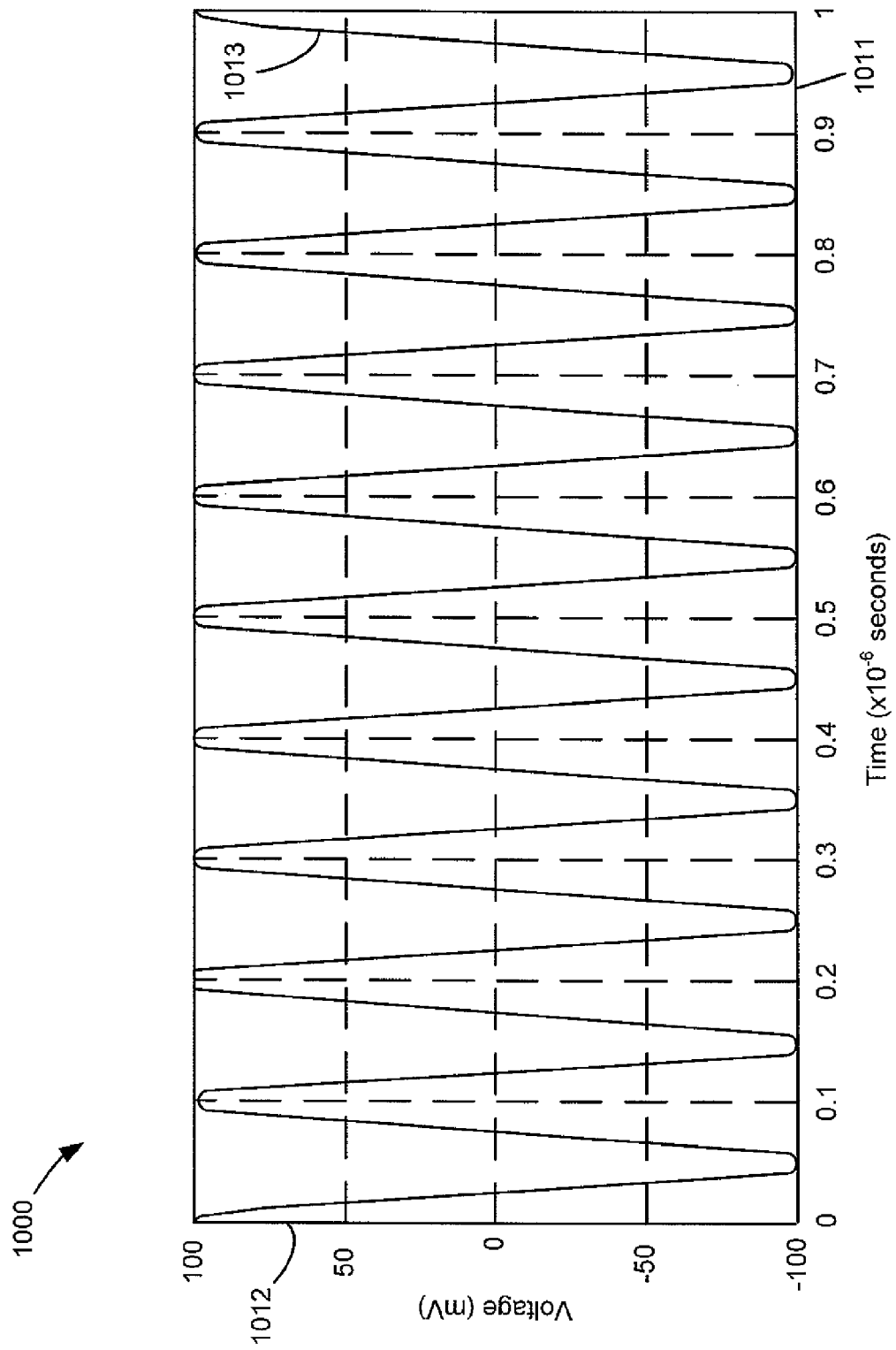
FIG. 10 is a graphical diagram depicting an example of an output signal of an embodiment of the direct transmitter shown in FIG. 4.

FIG. 10 is a graphical diagram 1000 depicting an example of an output signal 1013 of an embodiment of a direct transmitter 101 (FIG. 4). The output signal 1013 is at an antenna 496 (FIG. 4) of the transmitter 101. The graphical diagram 1000 includes a horizontal axis 1011 representing time in microseconds (µs) and a vertical axis 1012 representing voltage in millivolts (mV). In this example, the output voltage 1013 varies between about −100 mV and 100 mV and has a frequency of about 10 MHz.

Figure 11:
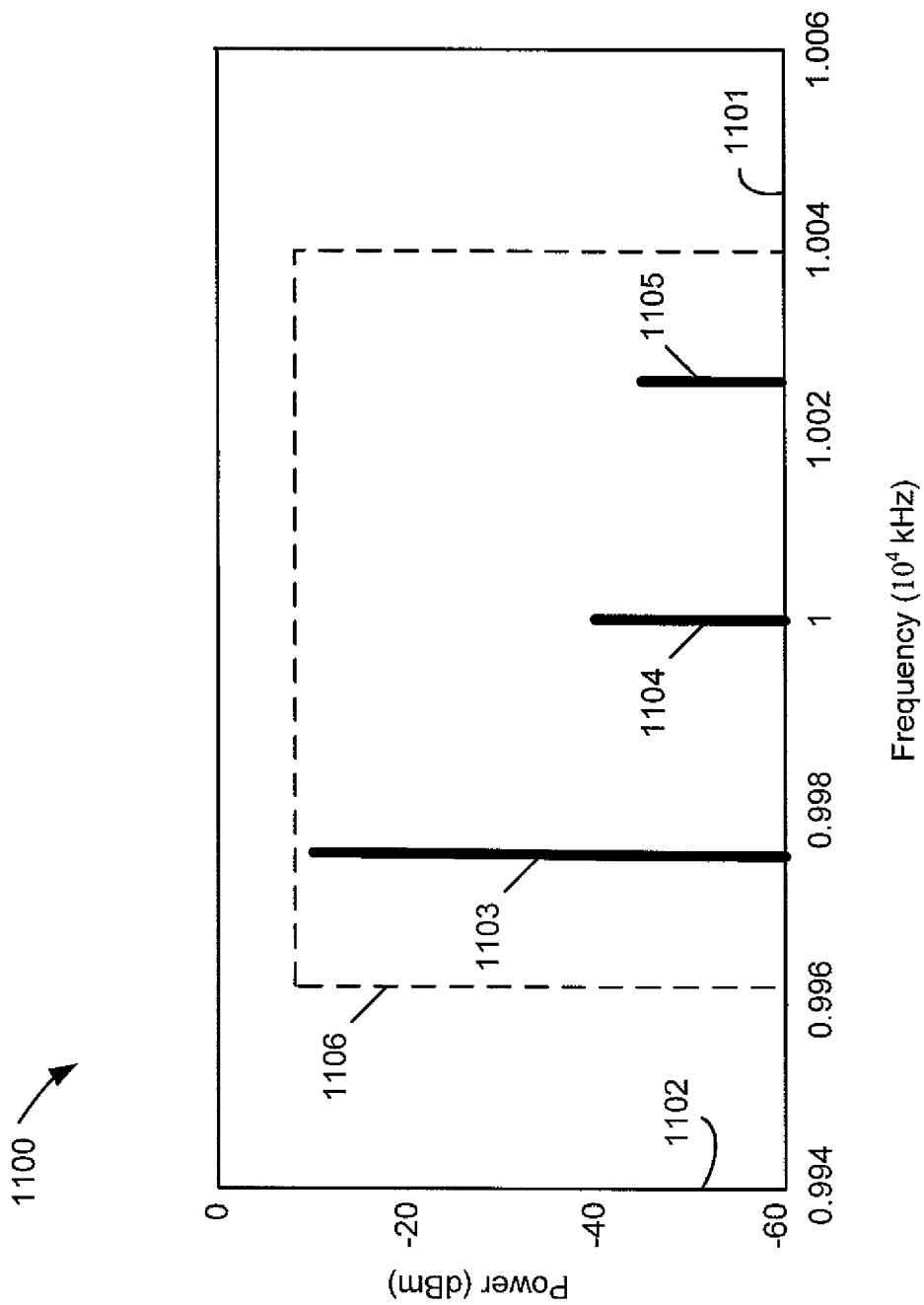
FIG. 11 is a graphical diagram depicting an example of significant spectrum components corresponding to an output signal shown in FIG. 10.

FIG. 11 is a graphical diagram 1100 depicting an example of significant spectrum components 1106 corresponding to the output signal 1013 (FIG. 10). The graphical diagram 1100 includes a horizontal axis 1101 representing frequency in $10^4$ kHz and a vertical axis 1102 representing power in dBm. The spectrum components 1106 include a lower sideband (LSB) 1103 at a frequency of about $0.9975 \times 10^4$ kHz, an upper side band (USB) 1105 at a frequency of about $1.0025 \times 10^4$ kHz, and an LO feed-through tone 1104 at a frequency of about $1 \times 10^4$ kHz. The USB 1105 has a power rating of about −45 dBm, the LSB 1103 has a power rating of about −10 dBm, and the LO feed-through tone 1104 has a power rating of about −40 dBm. The output signal 1013 also include less significant components that are not shown in FIG. 11.

Figure 12:
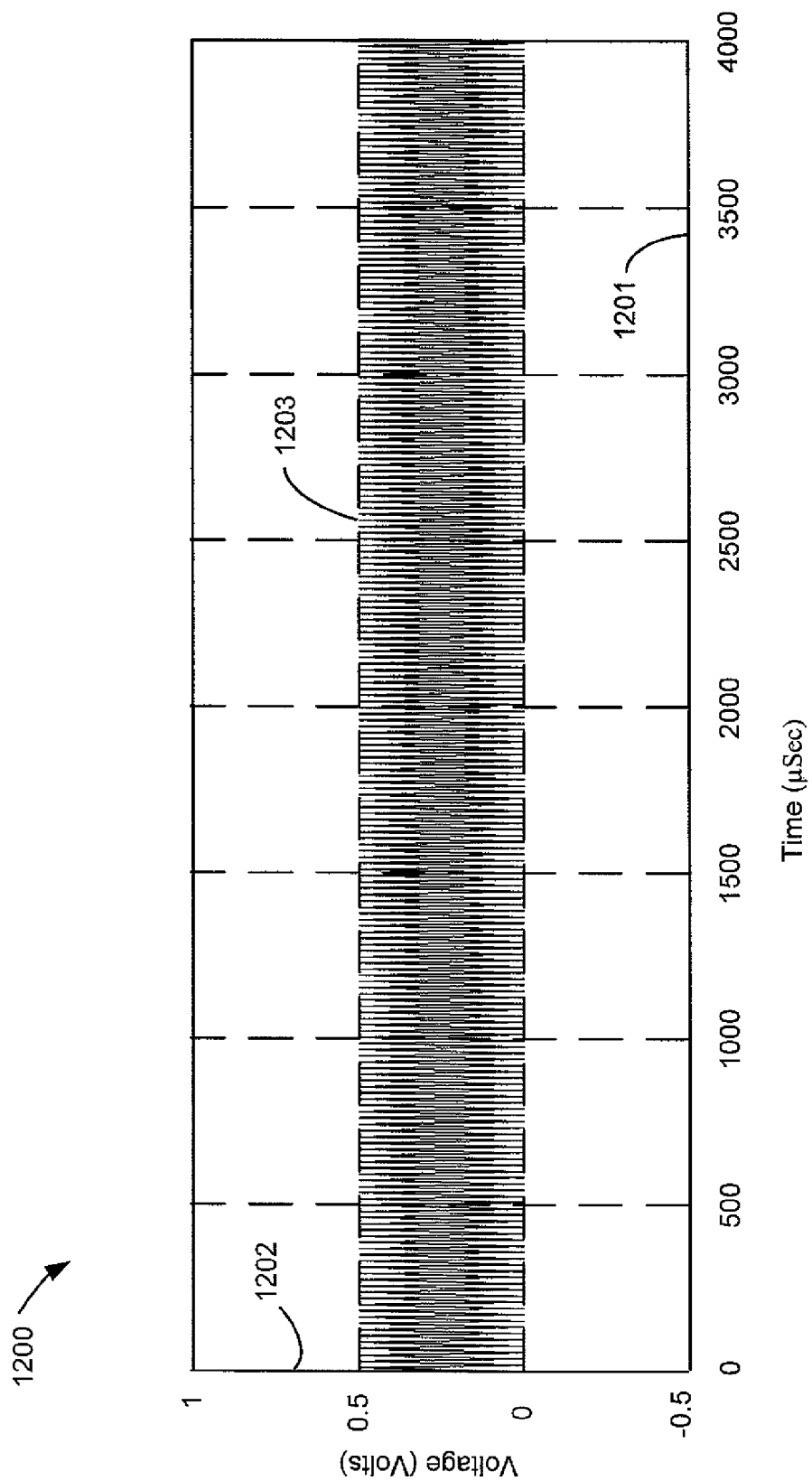
FIG. 12 is a graphical diagram depicting an example of an output signal of a detector shown in FIG. 3.

FIG. 12 is a graphical diagram 1200 depicting an example of an output signal 1203 of a detector 202 (FIG. 3). The graphical diagram 1200 includes a horizontal axis 1201 representing time in microseconds (µs) and a vertical axis 1202 representing voltage in volts. In this example, the voltage of the signal 1203 varies between about 0 V and 0.5 V.

Figure 13:
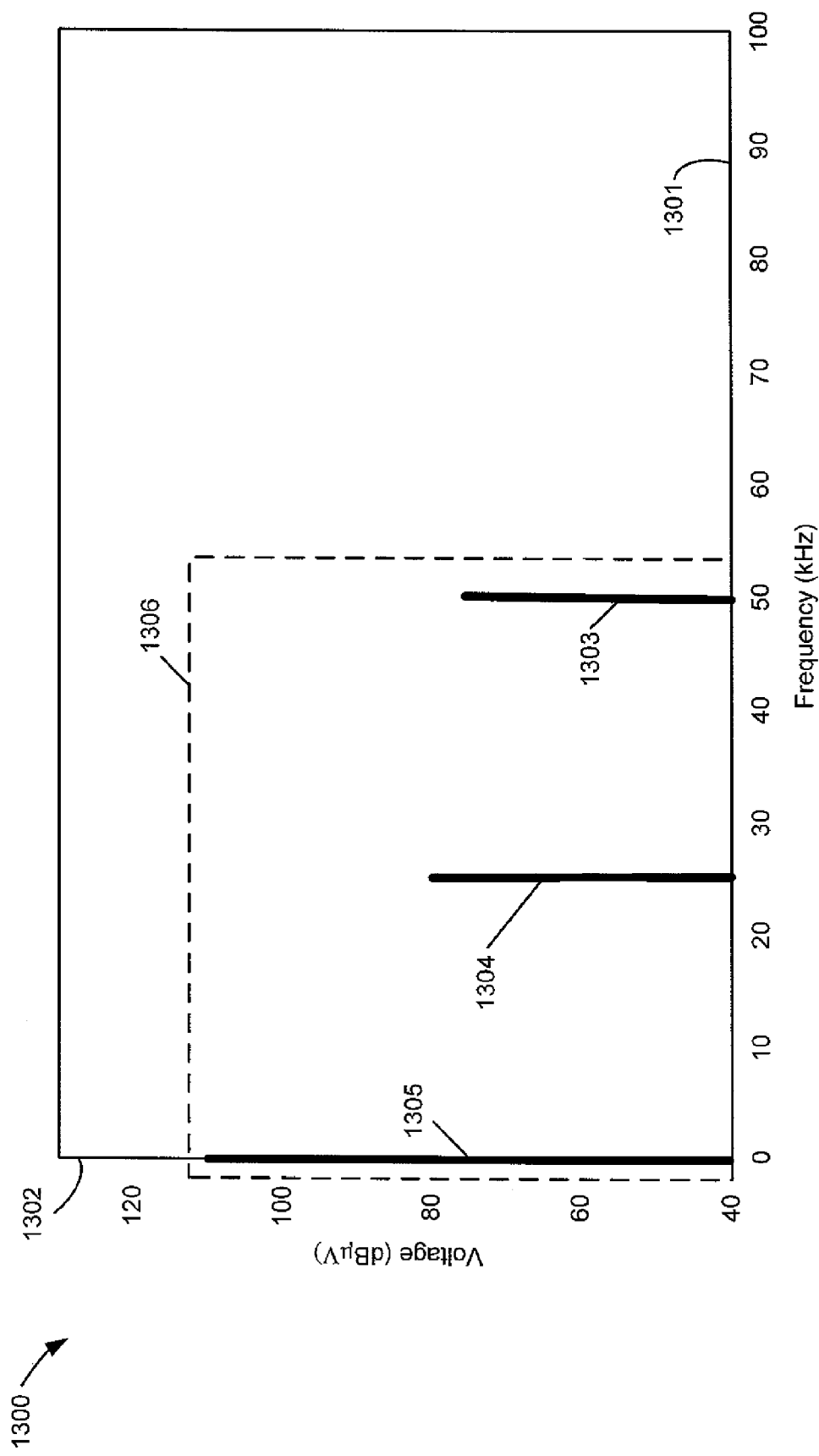
FIG. 13 is a graphical diagram depicting an example of significant spectrum components corresponding to a signal shown in FIG. 12.

FIG. 13 is a graphical diagram 1300 depicting an example of significant spectrum components 1306 corresponding to the signal 1203 (FIG. 12). The graphical diagram 1300 includes a horizontal axis 1301 representing frequency in kHz and a vertical axis 1302 representing voltage in dBpV. The spectrum components 1306 include a lower sideband 1305 at DC, an upper sideband 1303 at a frequency of about 50 kHz, and an LO feed-through tone 1304 at a frequency of about 25 kHz. The spectrum components 1306 are a result of a convolution of spectrum components 1106 (FIG. 11). In this example, lower sideband 1305 has a relative voltage of about 110 dBµV, upper sideband 1303 has a relative voltage of about 75 dBµV, and the LO feed-through tone 1304 has a relative voltage of about 80 dBµV. An output of a detector 202 also includes less significant components that are not shown in FIG. 13.

Figure 14:
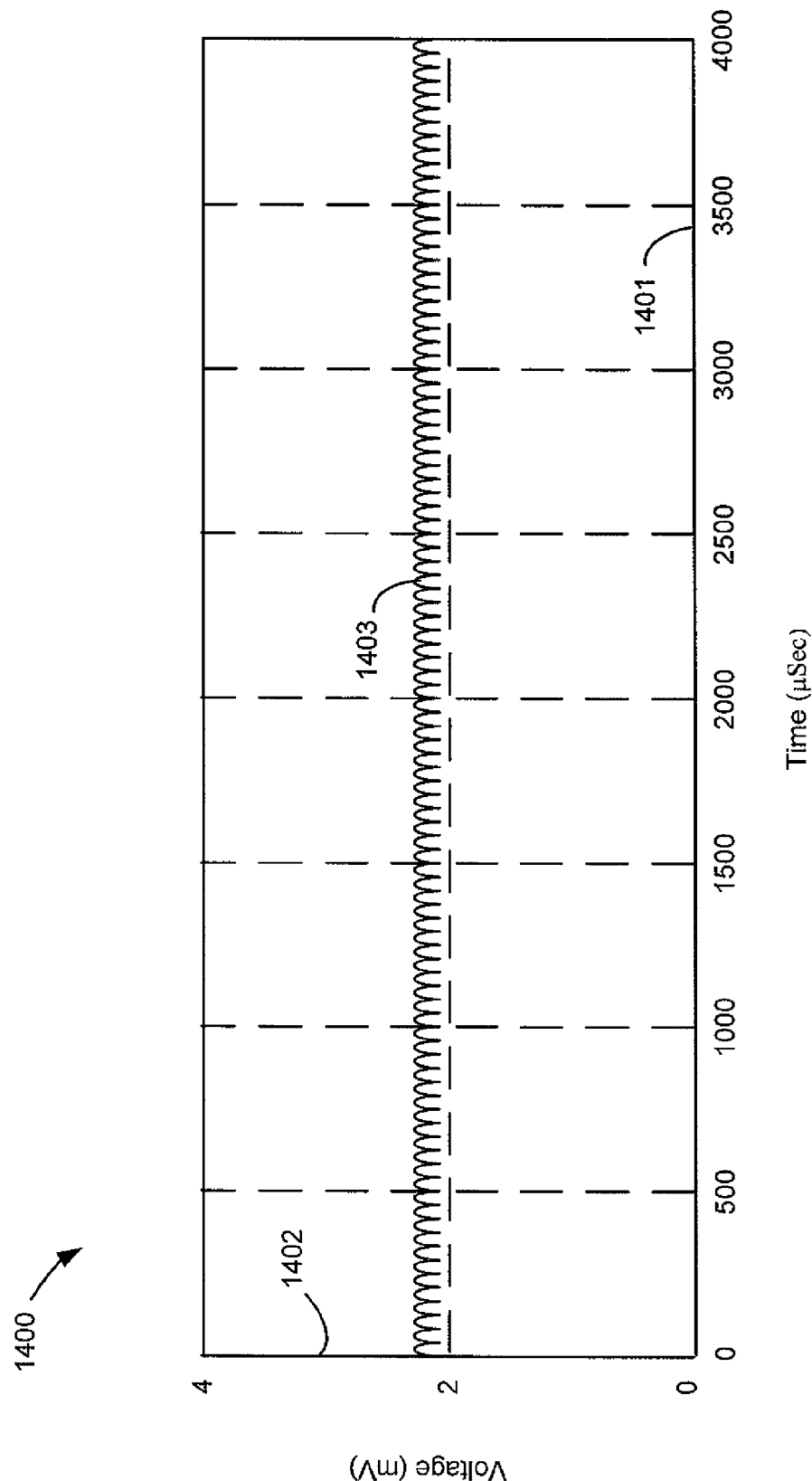
FIG. 14 is a graphical diagram depicting an example of a signal generated by filtering a signal shown in FIG. 12.

FIG. 14 is a graphical diagram 1400 depicting an example of a signal 1403 generated by low-pass filtering the signal 1203 (FIG. 12). The low-pass filtering of signal 1403 can be performed by, for example, an LPF 204 (FIG. 2). The graphical diagram 1400 includes a horizontal axis 1401 representing time in µs and a vertical axis 1402 representing voltage in millivolts (mV).

Figure 15:
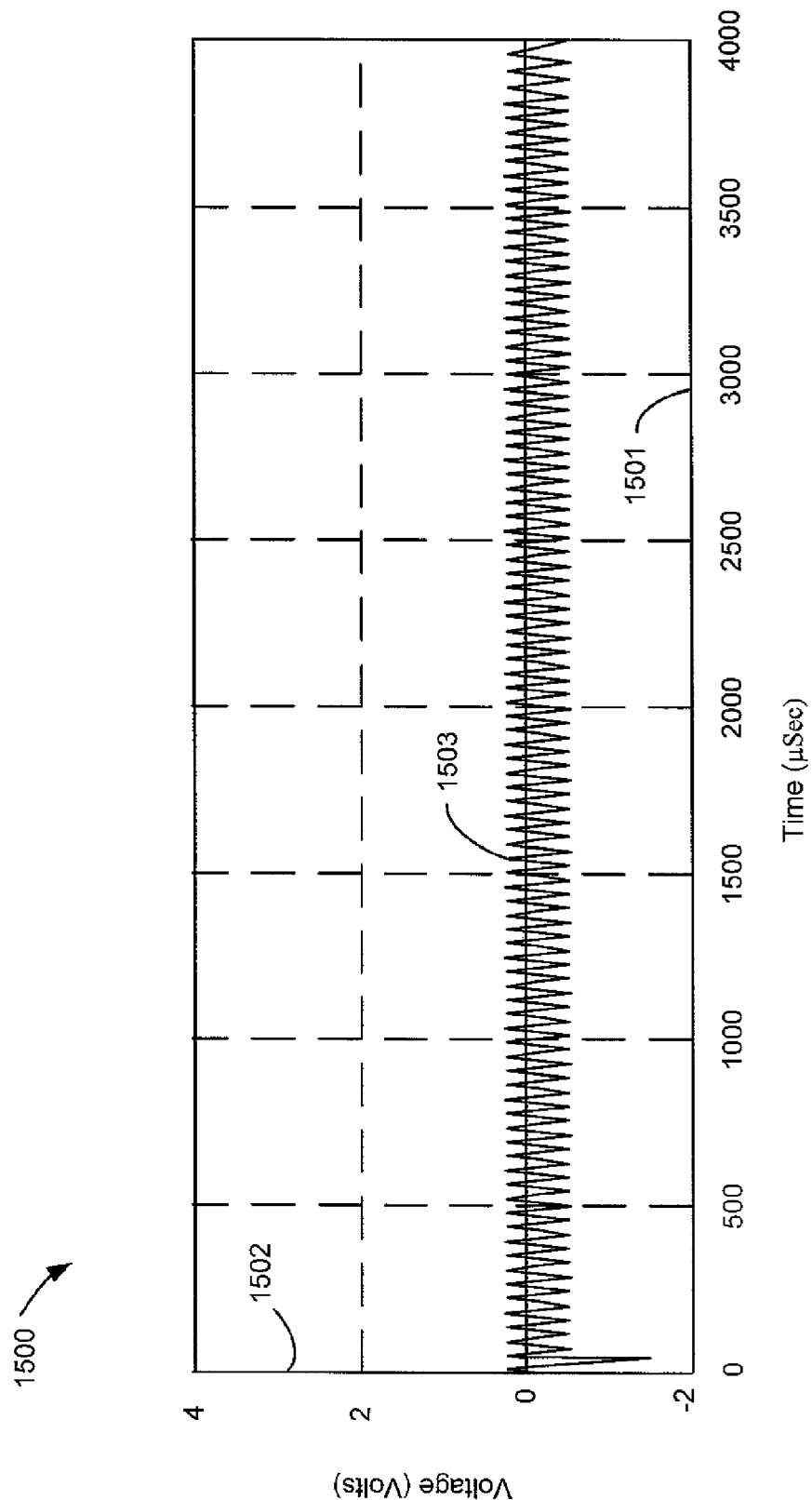
FIG. 15 is a graphical diagram depicting an example of a signal that is provided to an ADC shown in FIG. 3.

FIG. 15 is a graphical diagram 1500 depicting an example of a signal 1503 that is provided to an ADC 324 (FIG. 3). The graphical diagram 1500 includes a horizontal axis 1501 representing time in microseconds (µs) and a vertical axis 1502 representing voltage in volts. The ADC 324 is configured to digitize the signal 1503 and then provide the digitized signal to a digital filter 328 (FIG. 3).

Figure 16:
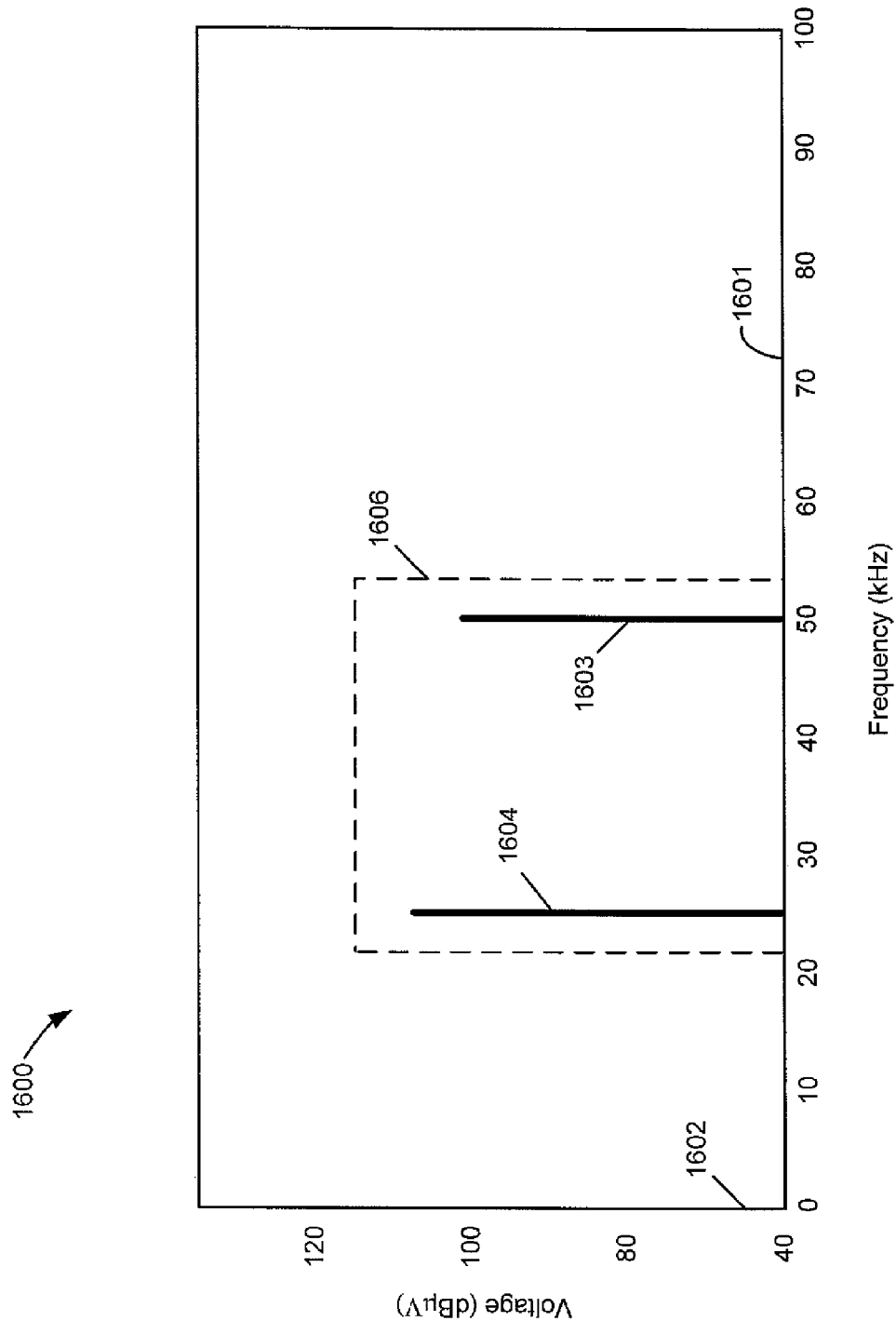
FIG. 16 is a graphical diagram depicting significant spectrum components corresponding to a signal shown in FIG. 15.

FIG. 16 is a graphical diagram 1600 depicting significant spectrum components 1606 corresponding to signal 1503 (FIG. 15). The graphical diagram 1600 includes a horizontal axis 1601 representing frequency in kHz and a vertical axis 1602 representing voltage in dBµV. The spectrum components 1606 include an upper sideband 1603 at a frequency of about 50 kHz and an LO feed-through tone 1604 at a frequency of about 25 kHz. The upper sideband 1603 has a relative voltage of about 102 dBµV, and the LO feed-through tone 1604 has a relative voltage of about 107 dBµV. The signal 1503 provided to the ADC 324 also includes less significant components that are not shown in FIG. 16. For example, the signal 1503 can include a lower sideband having a negligible magnitude.

Figure 17:
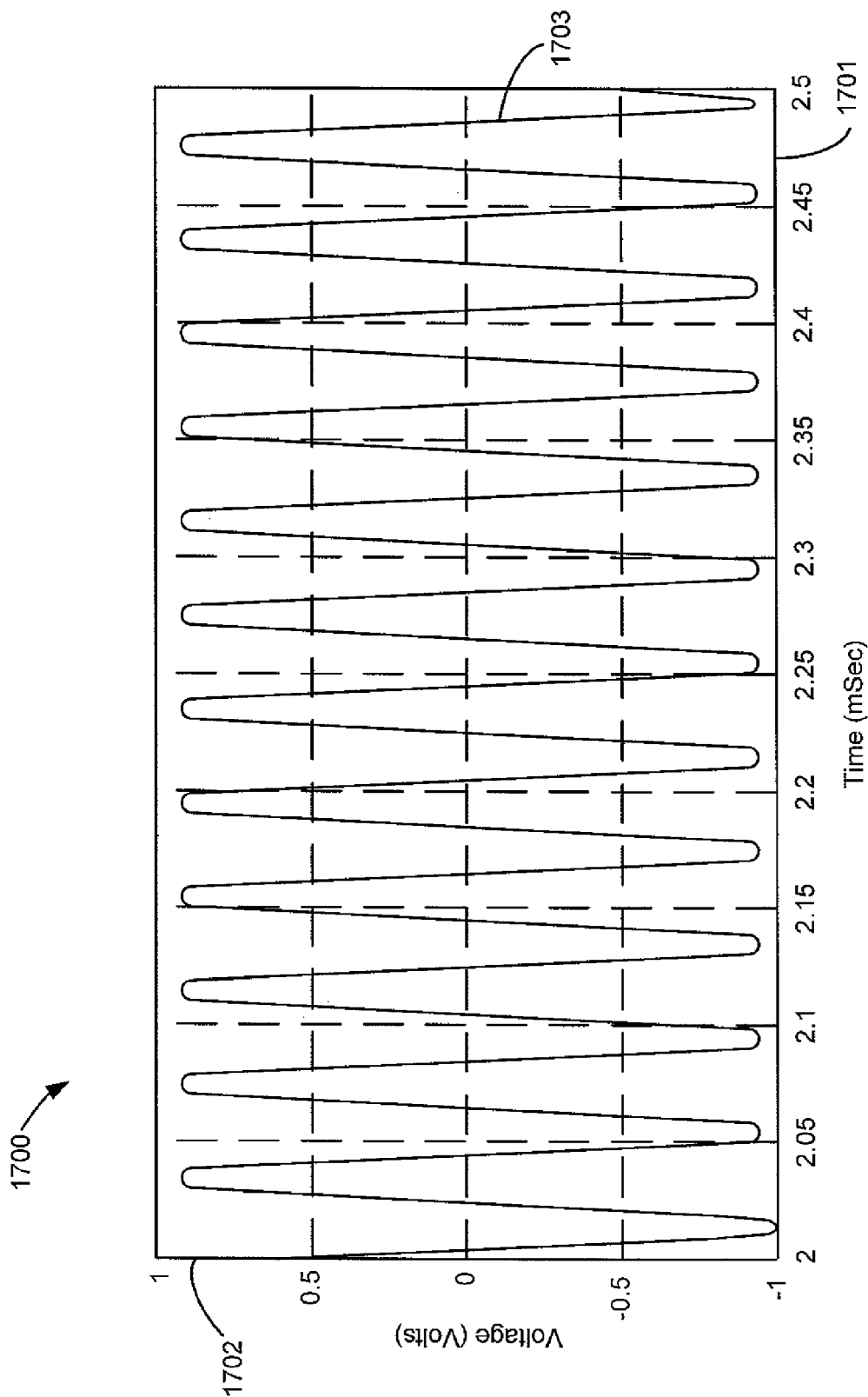
FIG. 17 is a graphical diagram depicting an example of an output signal of a digital filter shown in FIG. 3.

FIG. 17 is a graphical diagram 1700 depicting an example of an output signal 1703 of a digital filter 328 (FIG. 3). The graphical diagram 1700 includes a horizontal axis 1701 representing time in milliseconds (ms) and a vertical axis 1702 representing voltage in volts. In this example, the output signal 1703 has a voltage that generally varies between about −0.9 V and 0.9 V. The digital filter 328 filters the signal 1703 and provides a filtered signal to a DC offset implementation system 212 (FIG. 3).

Figure 18:
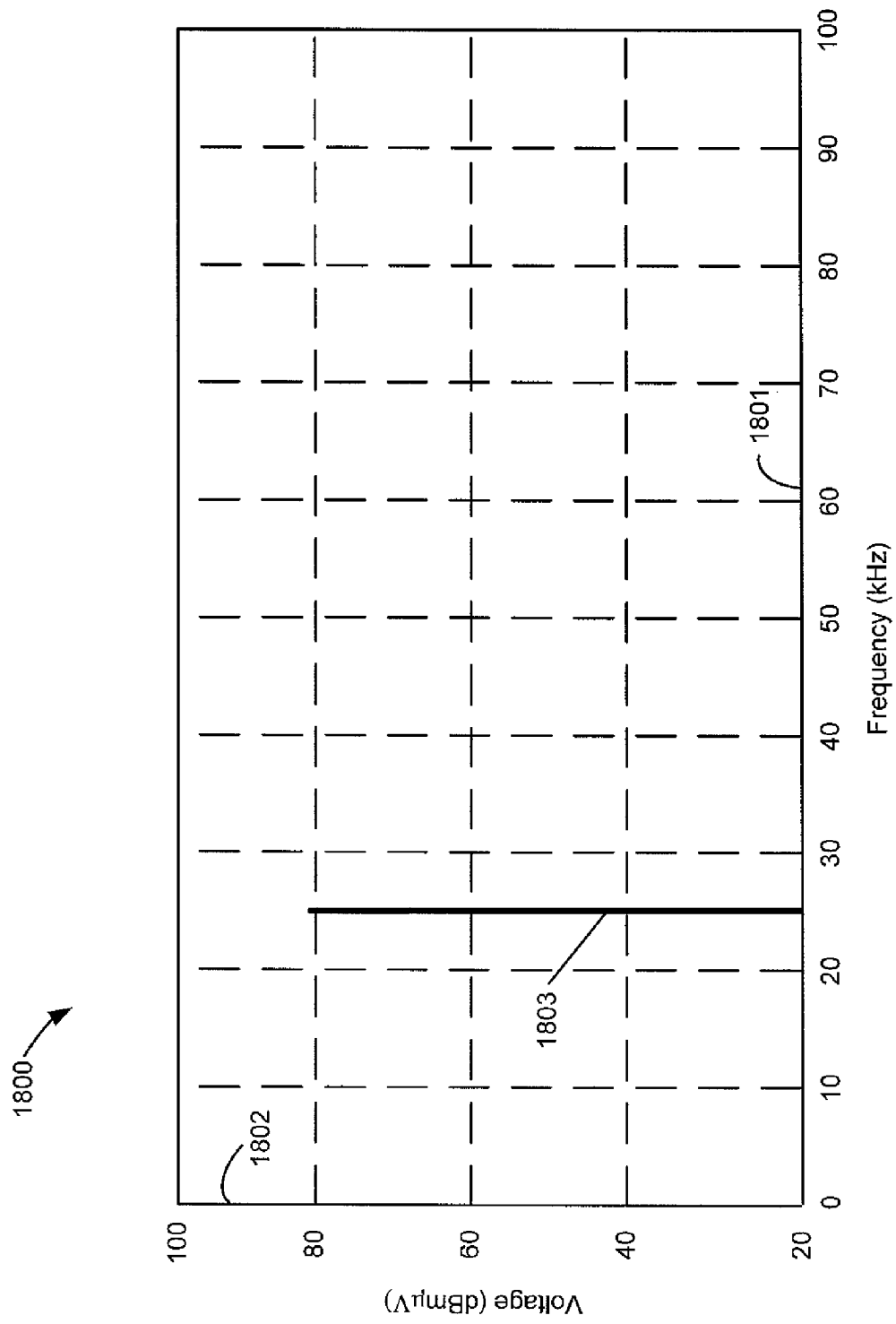
FIG. 18 is a graphical diagram depicting an example of an LO feed-through tone output by the digital filter in shown in FIG. 3.

FIG. 18 is a graphical diagram 1800 depicting an example of an LO feed-through tone 1803 output by a digital filter 328 (FIG. 3). The graphical diagram 1800 includes a horizontal axis 1801 representing frequency in kHz and a vertical axis representing voltage in dBµV. The LO feed-through tone 1803 has frequency of about 25 kHz and a relative voltage of about 81 dBµV. The output of the digital filter 328 also includes less significant components (not shown in FIG. 18) having a relative voltage below 60 dBµV and respective frequencies between DC and about 60 kHz. For example, the output of the digital filter 328 can include lower and upper sidebands having negligible magnitudes.

Figure 19A:
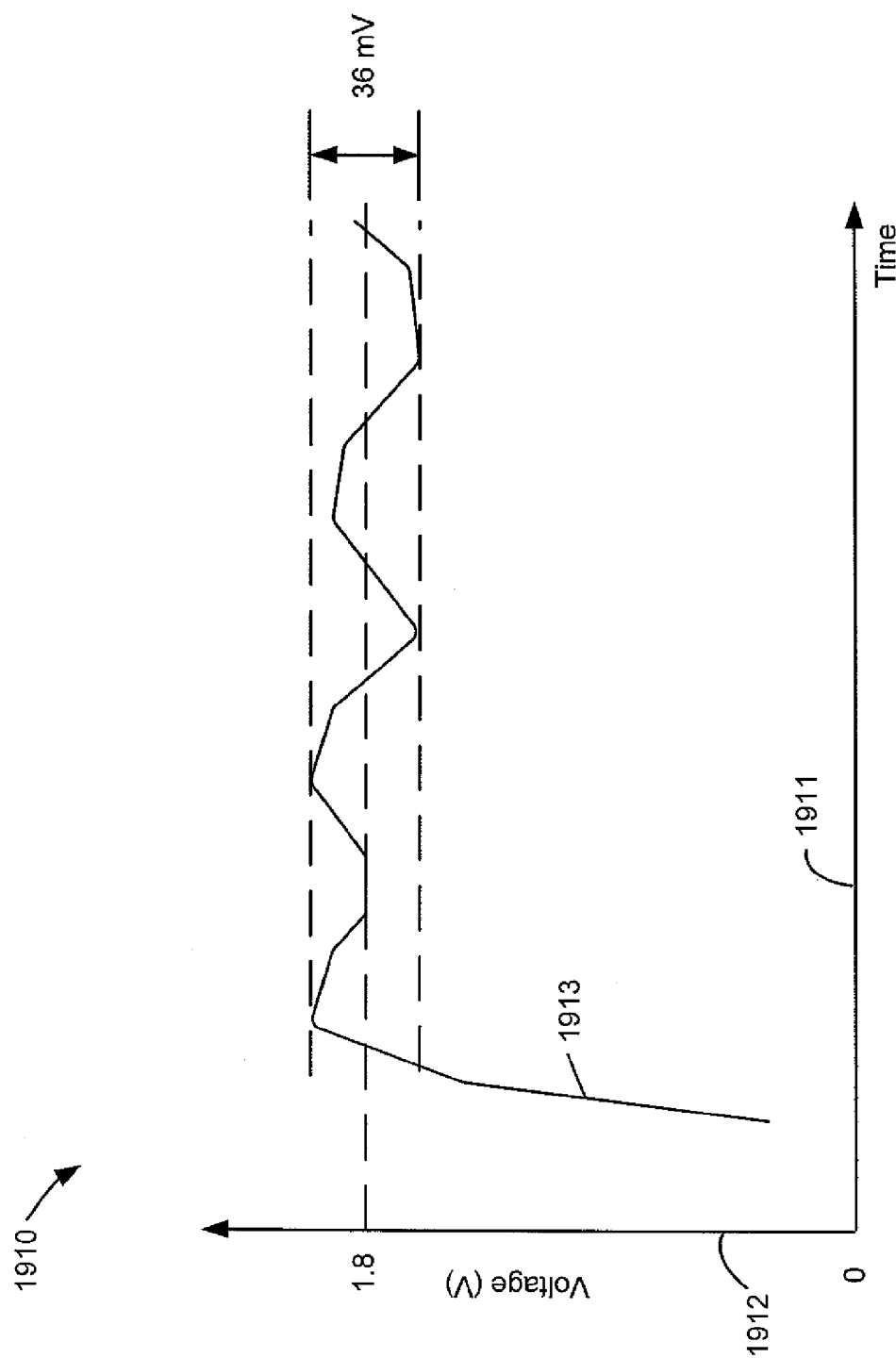
FIG. 19A is a graphical diagram depicting an example of a signal output by a detector shown in FIG. 3.

FIG. 19A is a graphical diagram 1910 depicting an example of a signal 1913 at an output of a detector 202 (FIG. 3). The graphical diagram 1910 includes a horizontal axis 1911 representing time and a vertical axis 1912 representing voltage in volts. In this example, the voltage of the signal 1913 increases to about 1.8 V after the detector 202 receives an RF signal from a transmitter 101 (FIG. 4). The signal 1913 has a peak-to-peak range of about 36 mV.

Figure 19B:
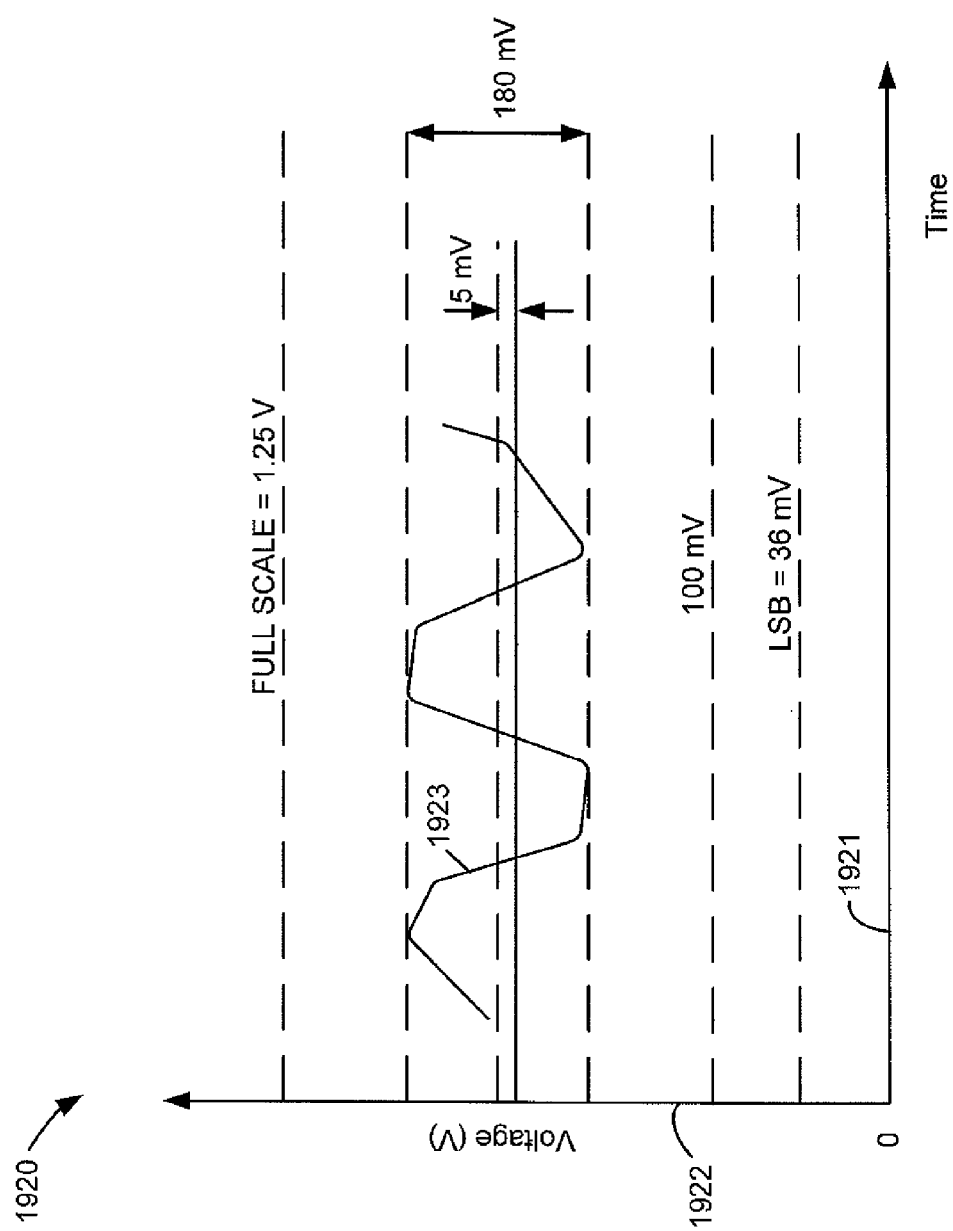
FIG. 19B is a graphical diagram depicting an example of a signal output by an amplifier shown in FIG. 3.

FIG. 19B is a graphical diagram 1920 depicting an example of a signal 1923 at an output of an amplifier 315 (FIG. 3). The graphical diagram 1920 includes a horizontal axis 1921 representing time and a vertical axis 1922 representing voltage in volts. In this example, the voltage of the signal 1923 has a peak-to-peak range of about 180 mV and a DC offset of about 5 mV. The signal 1923 is provided to an ADC 324 (FIG. 3). The signal 1923 is within a range of, for example, 100 mV to 1.25V for which the ADC 324 is configured to function properly. In an embodiment, the ADC 324 has a least significant bit (LSB) step of 36 mV and a full scale (FS) of 1.25V.

Figure 20:
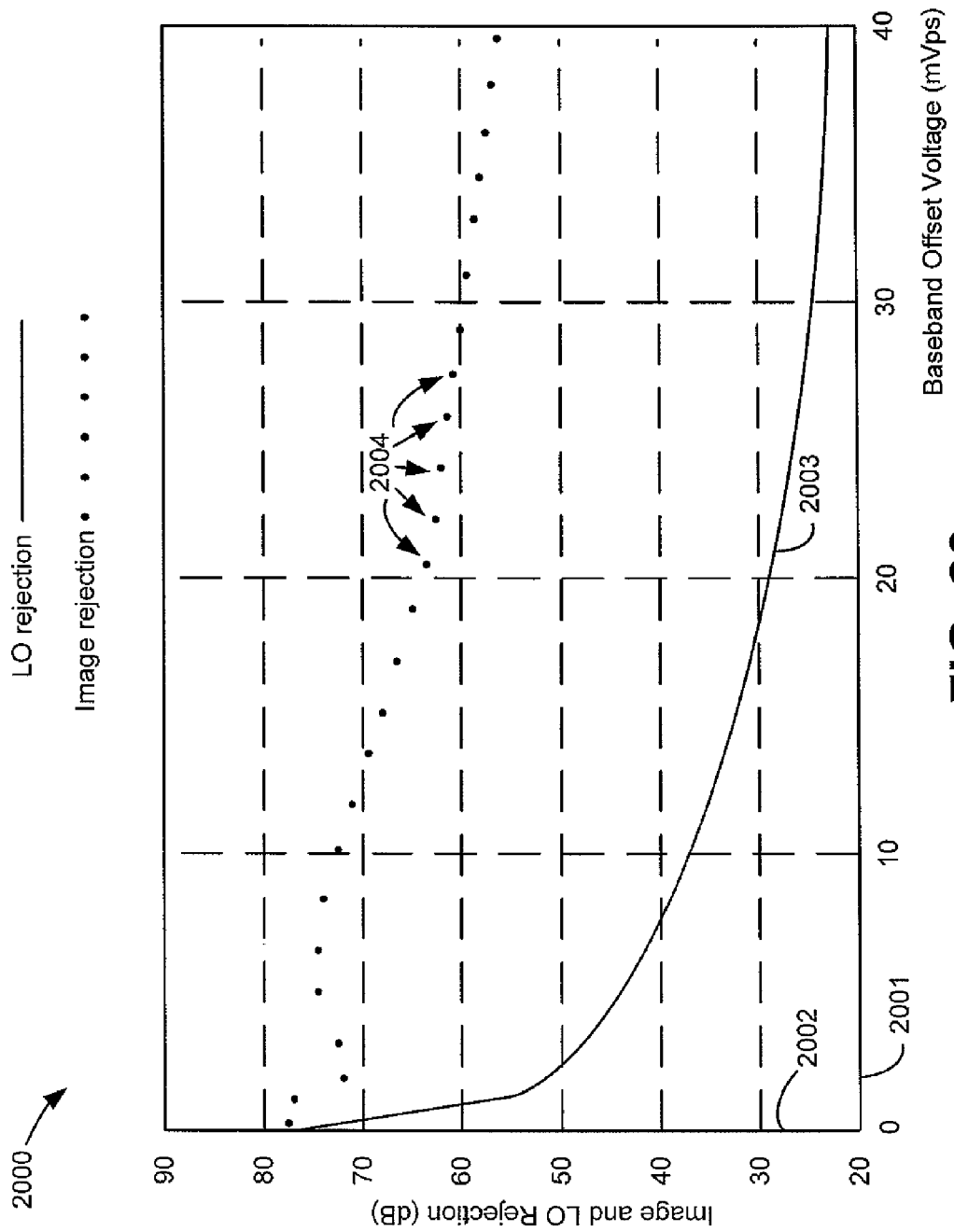
FIG. 20 is a graphical diagram depicting an example of LO rejection and image rejection in a mixer shown in FIG. 4.

FIG. 20 is a graphical diagram 2000 depicting an example of LO rejection 2003 and image rejection 2004 in a mixer 433 or 483 (FIG. 4). The graphical diagram 1920 includes a horizontal axis 2001 representing a baseband offset voltage in millivolts per second (mVps) and a vertical axis 2002 representing a rejection level in dB. Note that there is an inverse correlation between a baseband offset voltage and LO rejection 2003. There is also an inverse correlation between a baseband offset voltage and image rejection 2004 for offset voltages greater than about 10 mVps.

Although it is not necessary to calibrate an image of a transmission signal, the LO feed-through control system 102 (FIG. 3) can be used to measure image suppression. If a digital filter 328 is configured to pass signals at 2Δf, and the DC offsets are adjusted separately on I and Q signals in the transmitter 101 (FIG. 4), then an amplitude mismatch can be calibrated using the LO feed-through control system 102.

A full image calibration can be achieved by adjusting phase (or perhaps a delay) of baseband or LO signals. Full image calibration can minimize image power while adjusting both phase and gain of the baseband I and Q signals. Furthermore, variable capacitive loads on the I and Q LO paths to a mixer 433 or 483 in the transmitter 101 can achieve fine tuning of the phase required for full image calibration.

Figure 21:
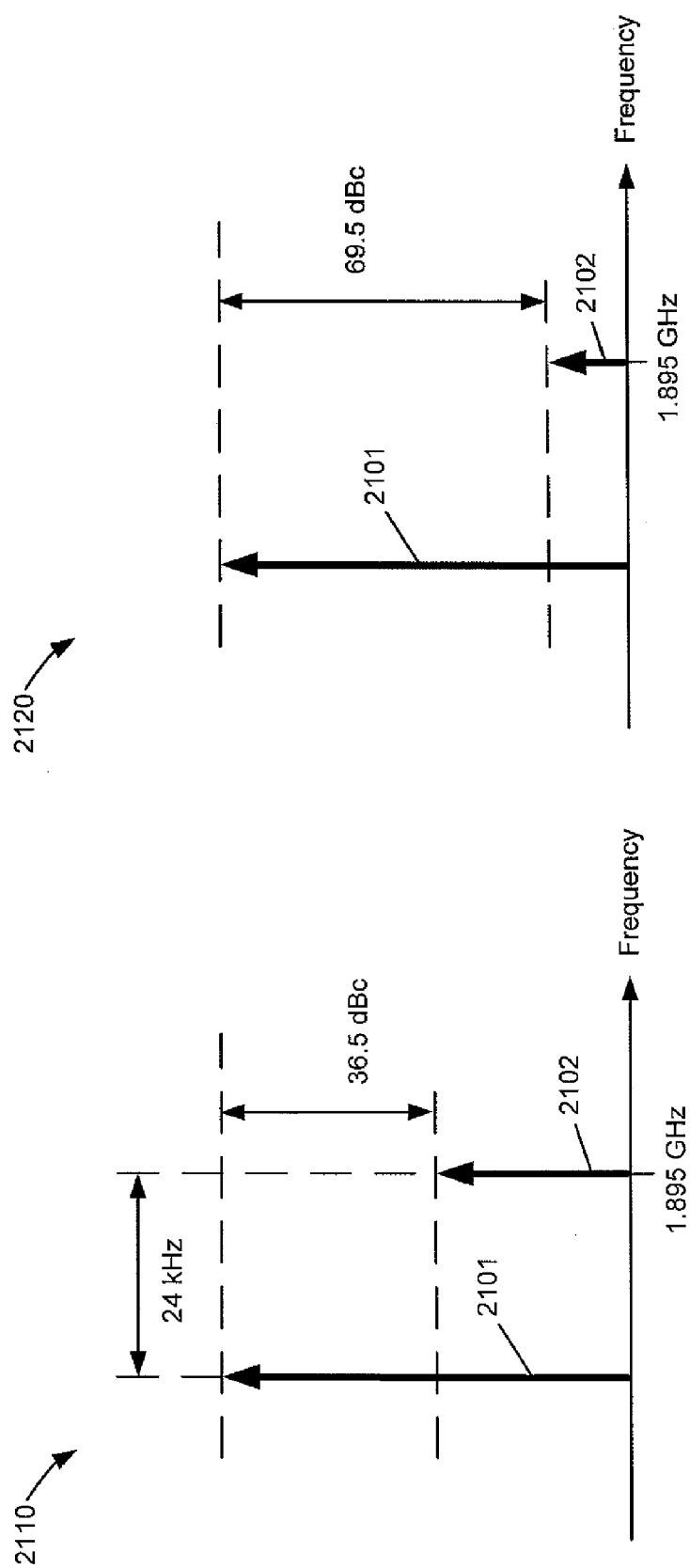
FIG. 21A depicts an exemplary output spectrum of an embodiment of a 1.9 GHz direct launch transmitter that is not subject to LO feed-through control.
FIG. 21B depicts an exemplary output spectrum of the 1.9 GHz direct launch transmitter after the transmitter is subject to LO feed-through control.

FIG. 21A depicts an exemplary output spectrum 2110 of an embodiment of a 1.9 GHz direct launch transmitter that is not subject to LO feed-through control. In this example, the 1.9 GHz direct launch transmitter is implemented in 0.18 micron RF complementary metal oxide semiconductor (CMOS) technology. The output spectrum 2110 includes a sideband tone 2101 and an LO feed-through tone 2102. The LO feed-through tone 2102 is at a frequency of about 1.8954483 GHz. The sideband tone 2101 is at a frequency that is about 24 kHz below the frequency of the LO feed-through tone 2102. The LO feed-through tone 2102 has a power level that is about 36.5 dBc below the power level of the sideband tone 2101.

FIG. 21B depicts an exemplary output spectrum 2120 of the 1.9 GHz direct launch transmitter after the transmitter is subject to LO feed-through control. After an LO feed-through control system 102 (FIG. 3) is used to control LO feed-through in the 1.9 GHz direct launch transmitter, the LO feed-through tone 2102 is reduced to a power level that is about 69.5 dBc below the power level of the sideband tone 2101.

Figure 22:
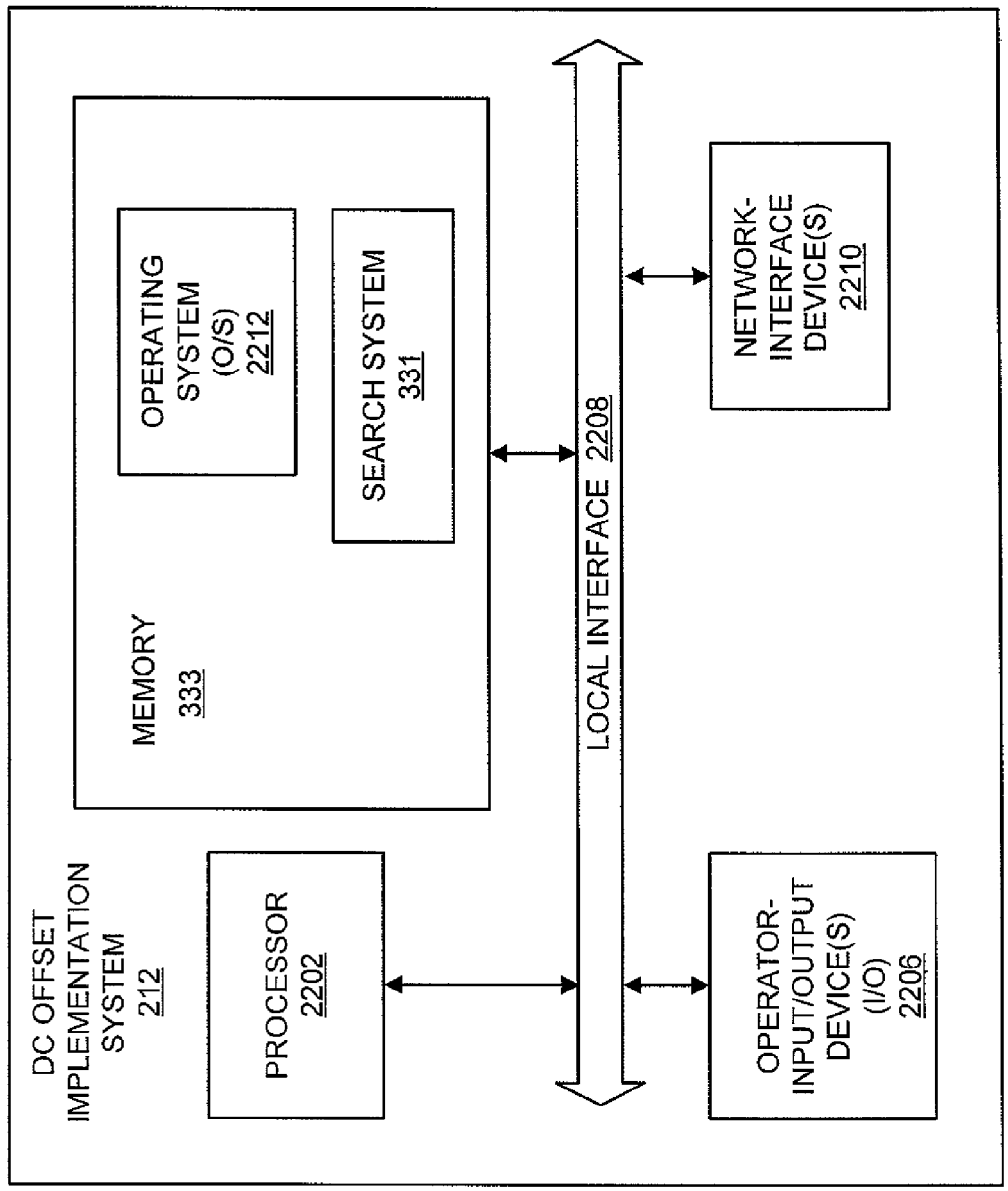
FIG. 22 is a block diagram illustrating an embodiment of a DC offset implementation system shown in FIG. 3.

FIG. 22 is a block diagram illustrating an embodiment of DC offset implementation system 212 (FIG. 3). Note that a DC offset implementation system 212 may alternatively be implemented in firmware and/or hardware (e.g., via an ASIC (application specific integrated circuit)). The DC offset implementation system 212 includes a processor 2202, memory 333, network interface device(s) 2210, and one or more user input and/or output (I/O) device(s) 2206 (or peripherals) that are communicatively coupled via a local interface 2208.

The local interface 2208 can be, for example but is not limited to, one or more buses or other wired or wireless connections, as is known in the art. The local interface 2208 might have additional elements, which are omitted for simplicity, such as controllers, buffers (caches), drivers, repeaters, and receivers, to enable communications. Further, the local interface 2208 might include address, control, and/or data connections to enable appropriate communications among the aforementioned components.

The processor 2202 is a hardware device for executing software, particularly that stored in memory 333. The processor 2202 can be any custom made or commercially available processor, a central processing unit (CPU), an auxiliary processor among several processors, a semiconductor based microprocessor (in the form of a microchip or chip set), or generally any device for executing software instructions.

The memory 333 can include any one or combination of volatile memory elements (e.g., RAM, such as DRAM, SRAM, SDRAM, etc.) and nonvolatile memory elements (e.g., ROM, flash memory, etc.). Moreover, the memory 333 might incorporate electronic, magnetic, optical, and/or other types of storage media. Note that the memory 333 can have a distributed architecture, where various components are situated remote from one another, but can be accessed by the processor 2202.

The user I/O device(s) 2206 includes input devices such as, for example but not limited to, a keyboard, a mouse, a scanner, a microphone, and/or a touch sensitive display, etc. Furthermore, the user I/O device(s) 2206 also include output devices such as, for example, but not limited to, a printer, a speaker, and/or a display, etc. The network interface device (s) 2210 include, for example, a modem, a radio frequency (RF) or other transceiver, a telephonic interface, an Ethernet interface, a bridge, and/or a router.

Software stored in memory 333 may include one or more separate programs, each one of which comprises an ordered listing of executable instructions for implementing logical functions. In the example of FIG. 22, the software in the memory 333 includes operating system 2212 and a search system 331. Among other things, the operating system 2212 essentially controls the execution of the search system 331 and provides scheduling, input-output control, file and data management, memory management, and communication control and related services.

The search system 331 is used by the DC offset implementation system 212 to determine optimal I and Q DC offsets for a direct transmitter 101 (FIG. 1). The optimal DC offsets are calculated to minimize or substantially eliminate local oscillator feed-through in an output signal of the direct transmitter 101. In an embodiment, the search system 331 is configured to cause the DC offset implementation system 212 to output a series of DC offset control signals that change DC offsets for an in-phase (I) and/or a quadrature-phase (Q) signal in a transmitter 101. The levels of LO feed-through corresponding to the DC offsets are then measured by the search system 331. Data identifying the measured levels of LO feed-through are stored by the search system in memory 333. DC offsets corresponding to a lowest level of LO feed-through are then selected by the search system applied to respective I and Q channels in the transmitter 101.

The search system 331 can be a source program, executable program (object code), script, or any other entity comprising a set of instructions to be performed. When implemented as a source program, the search system 331 is translated via a compiler, assembler, interpreter, or the like, which may or may not be included within the memory 333, so as to operate properly in connection with the O/S 2212. Furthermore, the search system 331 can be written in one or more object oriented programming languages, which have classes of data and methods, or procedure programming languages, which have routines, subroutines, and/or functions.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A method comprising:
    convolving signal components of a radio frequency (RF) signal generated by a transmitter to generate a detector signal, the detector signal having at least a side band tone and a local oscillator (LO) feed-through tone, the LO feed-through tone of the detector signal corresponding to a cross-product of a LO feed-through tone of the RF signal generated by the transmitter and a side band tone of the RF signal generated by the transmitter, the LO feed-through tone of the detector signal having a greater magnitude than a corresponding LO feed-through tone in the RF signal generated by the transmitter;

digitizing a processed version of the detector signal to generate a digitized signal using an analog-to-digital converter, the analog-to-digital converter having a sampling rate that is greater than two times a noise bandwidth of a filter in a signal path associated with the detector signal;

filtering the digitized signal to attenuate the side band tone and provide a filtered signal in which the LO feed-through tone has a greater magnitude than any other tone of the filtered signal;

detecting a signal level corresponding to LO feed-through in the RF signal of the transmitter based at least in part on said filtering; and responsive to detecting the signal level, modifying at least one of a direct current (DC) offset level for an in-phase (I) signal in the transmitter and a DC offset level for a quadrature-phase (Q) signal in the transmitter.

2. The method of claim 1 wherein said modifying is performed by applying an analog signal to at least one of the I signal or the Q signal.

3. The method of claim 1 wherein said modifying includes applying an output from a digital-to-analog converter to at least one of the I signal or the Q signal.

4. The method of claim 1 further comprising providing, using a power amplifier, an amplified version of the RF signal to an antenna.

5. The method of claim 1 wherein a plurality of diodes, a capacitor and an amplifier together perform said convolving.

6. The method of claim 1 further comprising injecting a test signal in the transmitter, the test signal having a test signal frequency, and the side band tone and the LO feed-through tone of the detector signal being separated in frequency by the test signal frequency.

7. A system comprising:
a detector circuit configured to generate a detector signal indicative of a convolution of spectral components of a radio frequency (RF) signal, the detector signal having a local oscillator (LO) feed-through tone having a greater magnitude than a corresponding LO feed-through tone of the RF signal;
a processor configured to detect an indication of LO feed-through in the RF signal and to adjust at least one of a direct current (DC) offset level of an in-phase (I) signal of a transmitter or a DC offset level in a quadrature-phase (Q) signal of the transmitter based at least partly on the indication of LO feed-through;
a filter electrically coupled between the detector circuit and the processor; and
an analog-to-digital converter electrically coupled between the detector circuit and the processor, the analog-to-digital converter having a sampling rate that is greater than two times a noise bandwidth of the filter.

8. The system of claim 7 further comprising a variable gain amplifier electrically coupled between the detector circuit and the analog-to-digital converter.

9. The system of claim 7 further comprising a multiplexer electrically coupled between the detector circuit and the analog-to-digital converter, the multiplexer having an input configured to receive at least one of temperature measurement input, a voltage measurement input, or a received signal strength indicator.

10. The system of claim 7 wherein the filter is a digital filter and an output of the digital filter has a spectral component corresponding to LO feed-through having a greater power than any other spectral component of the output of the digital filter.

11. The system of claim 7 wherein the processor is configured to cause an analog offset signal to adjust the DC offset level of at least one of I signal or the Q signal.

12. The system of claim 11 further comprising a digital-to-analog converter in communication with the processor, the digital-to-analog converter being configured to provide the analog offset signal to at least one of the I signal or the Q signal.

13. The system of claim g claim 7 wherein the detector circuit includes a plurality of diodes, a capacitor, and an amplifier together configured to generate the detector signal based on the RF signal.

14. The system of claim 7 further comprising a test signal generator configured to provide a test signal to the transmitter, the test signal having a test signal frequency, and the LO feed-through tone being at the test signal frequency.

15. The system of claim 7 wherein the filter is a digital filter electrically coupled between the analog-to-digital converter and the processor.

16. The system of claim 15 further comprising a second filter electrically coupled between the detector circuit and the analog-to-digital converter, the second filter configured to filter the detector signal so as to pass the LO feed-through tone of the detector signal.

17. The system of claim 7 wherein the LO feed-through tone of the detector signal corresponds to a cross-product of a LO feed-through tone of the RF signal and a side band tone of the RF signal.

18. The system of claim 7 wherein the detector circuit is a diode-based detector circuit.

19. The system of claim 7 wherein the detector signal has a side band tone.

20. A system comprising:
a detector circuit configured to generate a detector signal indicative of a convolution of spectral components of a radio frequency (RF) signal provided by a transmitter, the detector signal having at least a side band tone and a local oscillator (LO) feed-through tone, the LO feed-through tone of the detector signal corresponding to a cross-product of a LO feed-through tone of the RF signal provided by the transmitter and a side band tone of the RF signal provided by the transmitter;
a digital filter configured to attenuate the side band tone in an input to the digital filter and to generate a digital output based at least partly on the detector signal, the digital output having a signal component corresponding to LO feed-through in the RF signal provided by the transmitter, the signal component corresponding to LO feed-though in the RF signal having a greater magnitude than any other component of the digital output;
an analog-to-digital converter electrically coupled between the detector circuit and the digital filter, the analog-to-digital converter having a sampling rate that is greater than two times a noise bandwidth of the digital filter; and
a processor configured to adjust a direct current (DC) offset level in at least one of an in-phase (I) path of the transmitter or a quadrature-phase (Q) path of the transmitter based at least partly on the digital output of the digital filter, the digital filter being in a signal path between the detector circuit and the processor.

21. The system of claim 20 wherein the processor is configured to cause an analog offset signal to adjust the DC offset level in at least one of I path or the Q path in the analog domain.

22. The system of claim 20 further comprising a test signal generator configured to provide a test signal to the transmitter, the test signal having a test signal frequency, and the side band tone and a local oscillator (LO) feed-through tone being separated in frequency by the test signal frequency.

* * * * *

UNITED STATES PATENT AND TRADEMARK OFFICE
CERTIFICATE OF CORRECTION

PATENT NO. : 9,450,629 B2
APPLICATION NO. : 13/104378
DATED : September 20, 2016
INVENTOR(S) : Mark M. Cloutier, Tudor Lipan and Christian Cojocaru It is certified that error appears in the above-identified patent and that said Letters Patent is hereby corrected as shown below:

In the Specification

In Column 6 at Line 61, change "$\Delta$C" to --AC--.

In Column 15 at Line 40, change "dBpV." to --dBµV.--.

In the Claims

In Column 20 at Line 12 (approx.), in Claim 13, after "system of" delete "Claim g".

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*